(12) United States Patent
Murata et al.

(10) Patent No.: US 7,910,464 B2
(45) Date of Patent: Mar. 22, 2011

(54) METHOD FOR MANUFACTURING A SEMICONDUCTOR DEVICE HAVING A III-V NITRIDE SEMICONDUCTOR

(75) Inventors: Tomohiro Murata, Osaka (JP); Yutaka Hirose, Kyoto (JP); Tsuyoshi Tanaka, Osaka (JP); Yasuhiro Uemoto, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/695,759

(22) Filed: Jan. 28, 2010

(65) Prior Publication Data
US 2010/0129992 A1 May 27, 2010

Related U.S. Application Data

(60) Division of application No. 12/257,807, filed on Oct. 24, 2008, now abandoned, which is a continuation of application No. 11/019,768, filed on Dec. 23, 2004, now abandoned.

(30) Foreign Application Priority Data

Dec. 26, 2003 (JP) .................................. 2003-432886

(51) Int. Cl.
*H01L 21/20* (2006.01)
*H01L 21/36* (2006.01)
(52) U.S. Cl. .................... 438/483; 438/701; 257/E21.09
(58) Field of Classification Search .................. 438/483, 438/701; 257/E21.09
See application file for complete search history.

(56) References Cited

U.S. PATENT DOCUMENTS

| | | | |
|---|---|---|---|
| 5,205,905 A * | 4/1993 | Kotaki et al. ................ 438/714 |
| 5,326,995 A | 7/1994 | Ohori |
| 5,412,236 A | 5/1995 | Ikeya et al. |
| 5,925,895 A | 7/1999 | Sriram et al. |
| 6,307,221 B1 | 10/2001 | Danzilio |
| 6,307,245 B1 | 10/2001 | Kunii et al. |
| 6,956,239 B2 | 10/2005 | Sriram |
| 7,470,941 B2 | 12/2008 | Micovic et al. |

FOREIGN PATENT DOCUMENTS

JP 06-151464 5/1994
(Continued)

OTHER PUBLICATIONS

Furukawa, H., et al. "High power-added efficiency and low distortion GaAs power FET employing spike-gate structure", Solid-State Electronics, Elsevier Science Ltd., vol. 41, No. 10, pp. 1599-1604, 1997.
Chinese Office Action with English Translation issued in Chinese Patent Application No. CN 200410103700.X dated on Mar. 21, 2008.
Second Office Action, with English Translation, issued in Chinese Patent Application No. CN 200410103700.X, dated Dec. 19, 2008.

(Continued)

*Primary Examiner* — Howard Weiss
(74) *Attorney, Agent, or Firm* — McDermott Will & Emery LLP

(57) ABSTRACT

A semiconductor device of the present invention includes: a III-V nitride semiconductor layer including a channel region in which carriers travel; a concave portion provided in an upper portion of the channel region in the III-V nitride semiconductor layer; and a Schottky electrode consisting of a conductive material forming a Schottky junction with the semiconductor layer, and formed on a semiconductor layer, which spreads over the concave portion and peripheral portions of the concave portion, on the III-V nitride semiconductor layer. A dimension of the concave portion in a depth direction is set so that a portion of the Schottky electrode provided in the concave portion can adjust a quantity of the carriers traveling in the channel region.

6 Claims, 12 Drawing Sheets

FOREIGN PATENT DOCUMENTS

| | | |
|---|---|---|
| JP | 09-008061 | 1/1997 |
| JP | 09-082727 | 3/1997 |
| JP | 11-233526 | 8/1999 |
| JP | 2001-102354 A | 4/2001 |
| JP | 2002-359256 A | 12/2002 |

OTHER PUBLICATIONS

Chinese Office Action, w/ English translation thereof, issued in Chinese Patent Application No. CN 200410103700.X dated Apr. 17, 2009.

* cited by examiner

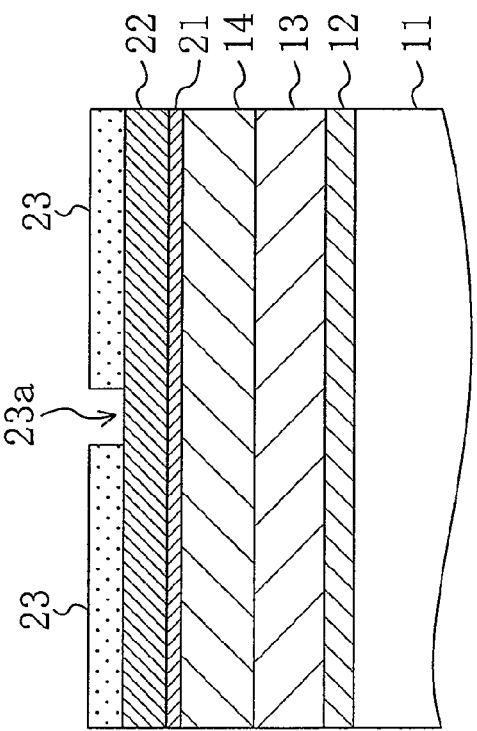
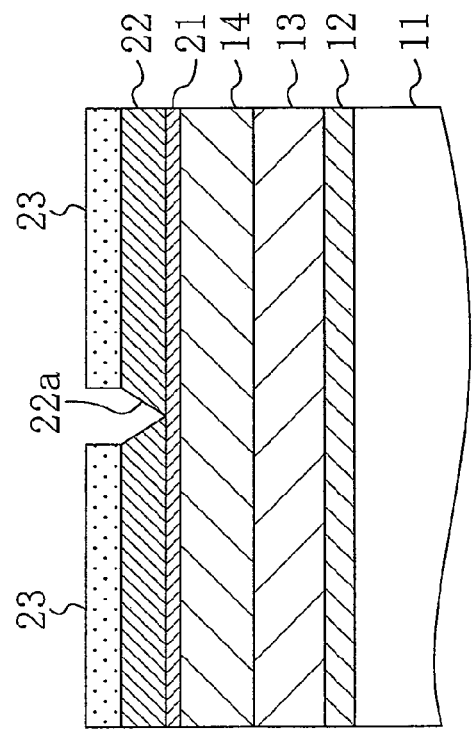
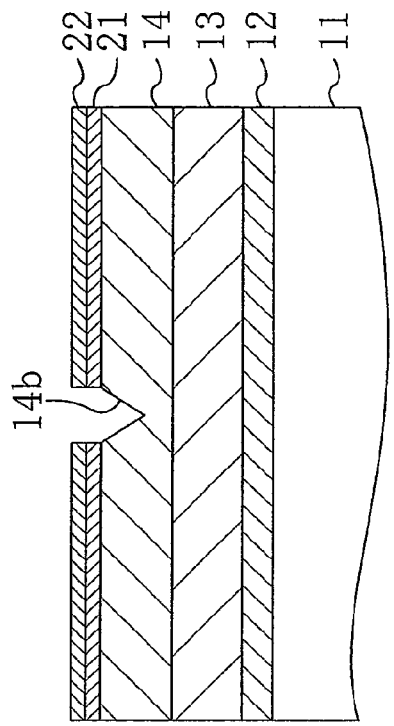
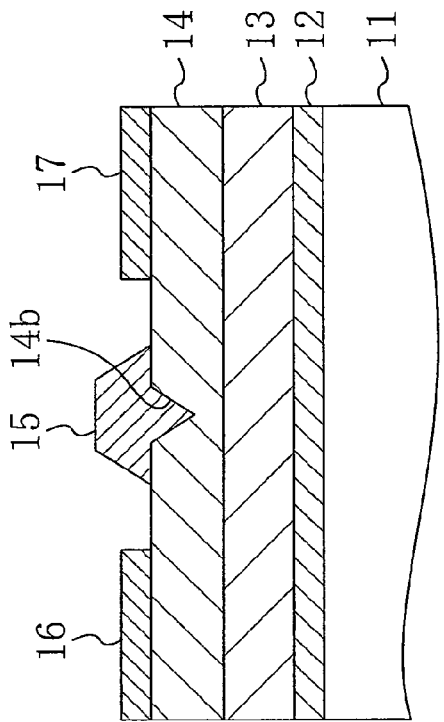

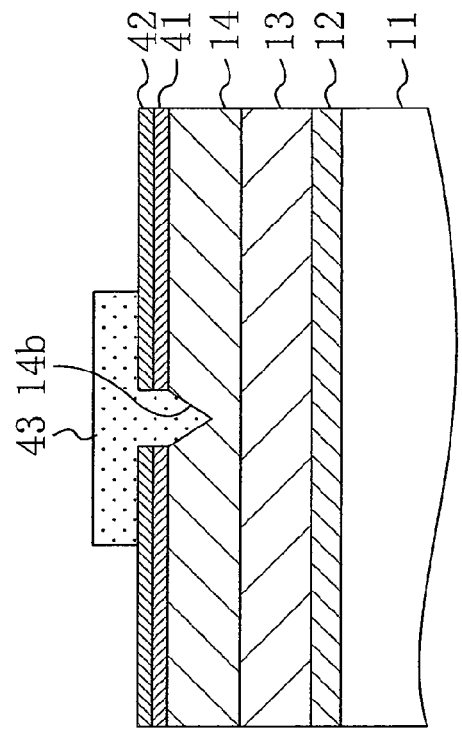
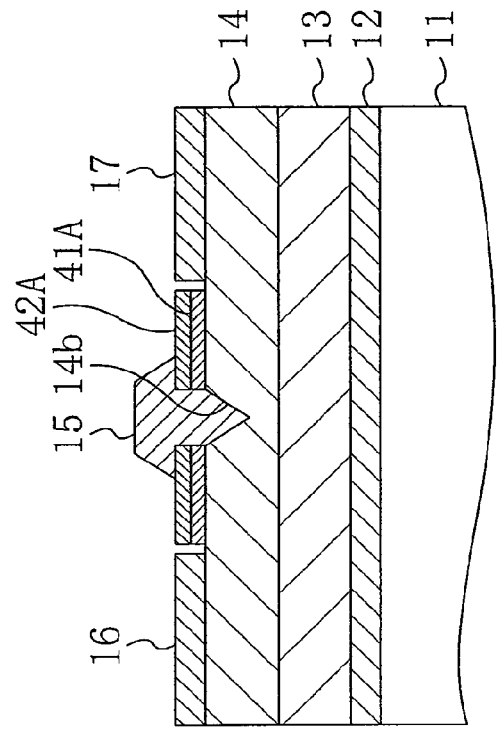
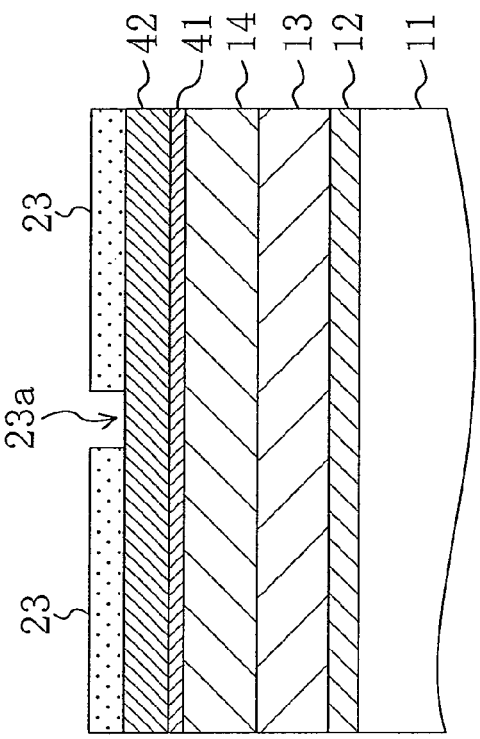
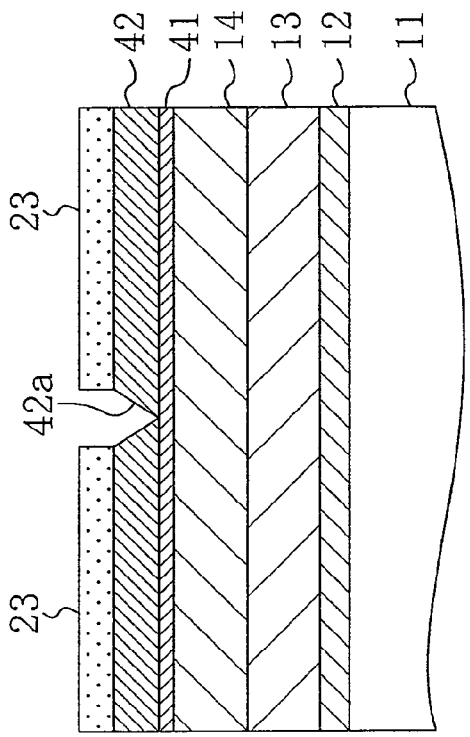

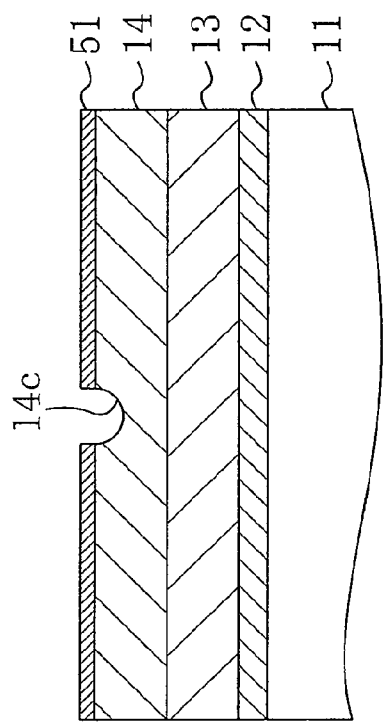
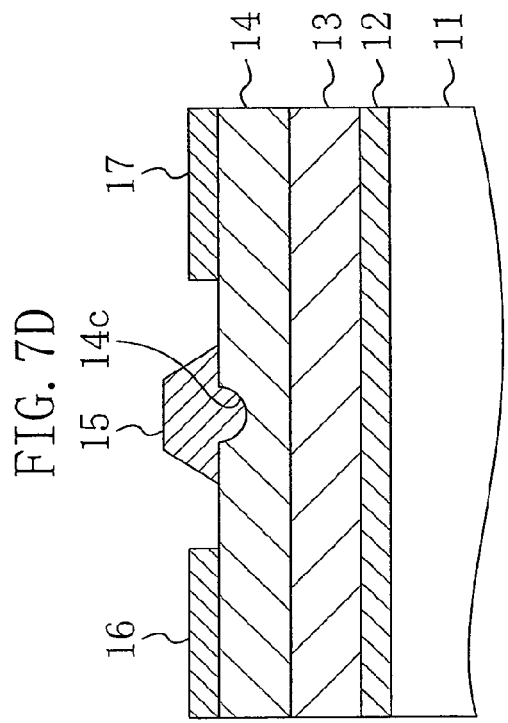
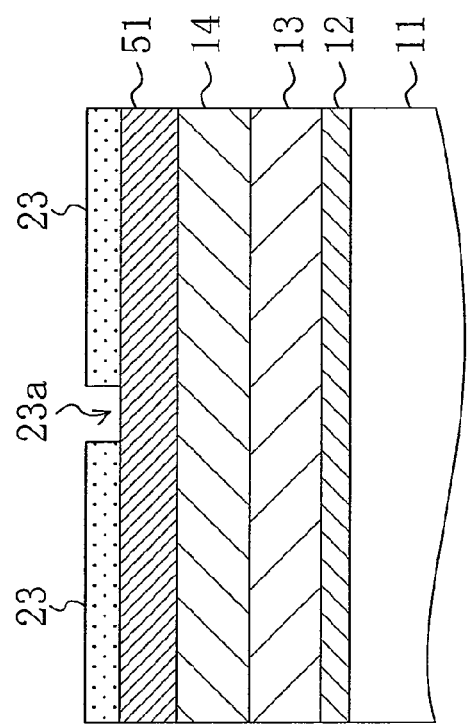
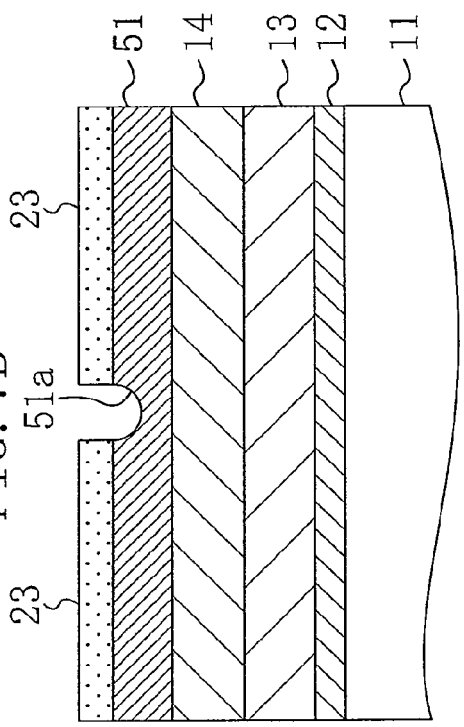

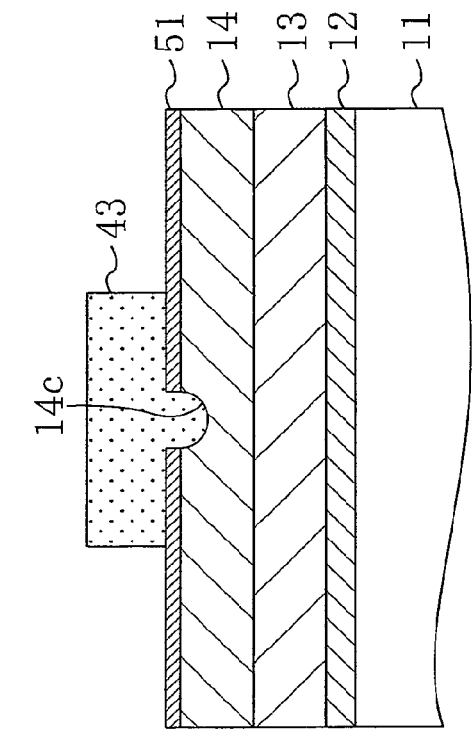
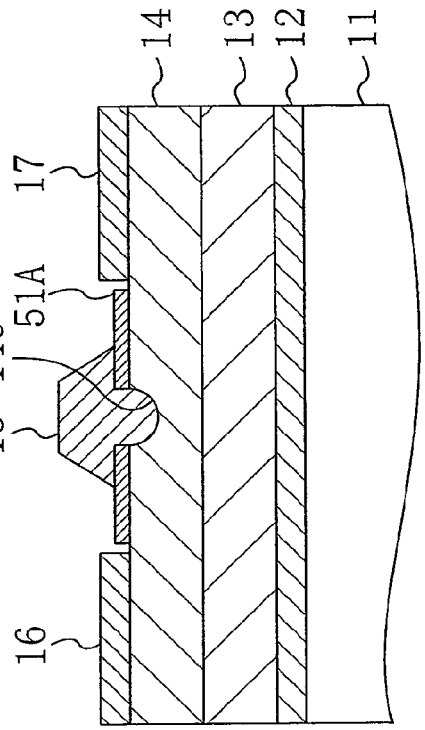
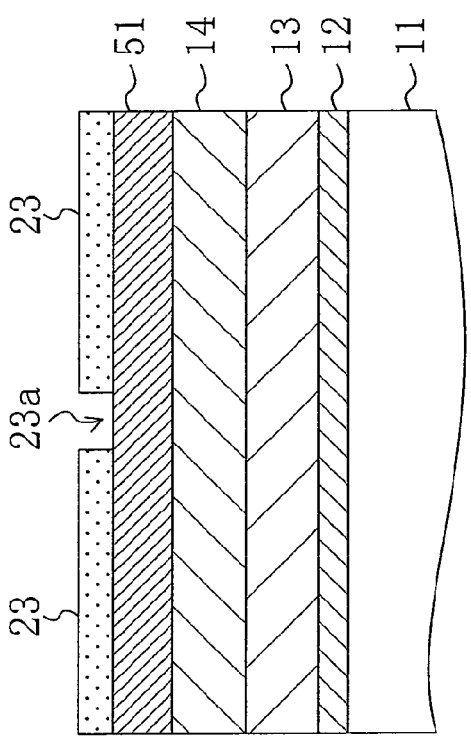
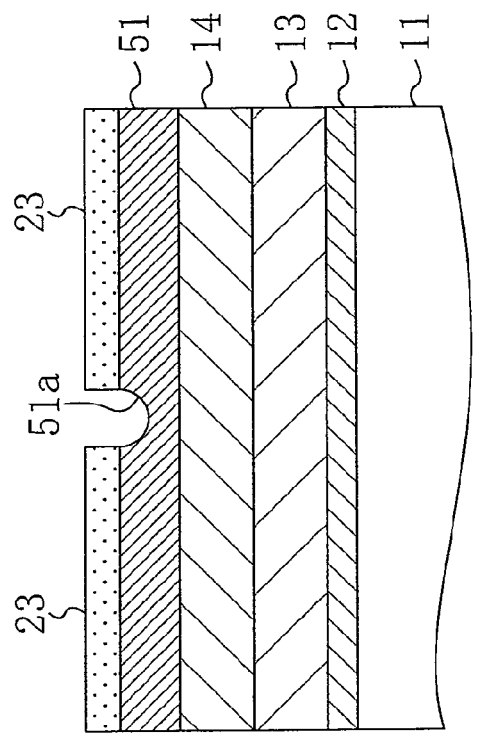

METHOD FOR MANUFACTURING A SEMICONDUCTOR DEVICE HAVING A III-V NITRIDE SEMICONDUCTOR

CROSS-REFERENCE TO RELATED APPLICATIONS

This application is a Divisional of U.S. application Ser. No. 12/257,807, filed on Oct. 24, 2008, now abandoned, which is a Continuation of U.S. application Ser. No. 11/019,768, filed on Dec. 23, 2004, now abandoned, claiming priority of Japanese Patent Application No. 2003-432886, filed on Dec. 26, 2003, the entire contents of each of which are hereby incorporated by reference.

BACKGROUND OF THE INVENTION

The present invention relates to a semiconductor device using a III-V nitride semiconductor and a method for manufacturing the semiconductor device. More specifically, the present invention relates to a semiconductor device having a Schottky electrode formed on a semiconductor layer consisting of a III-V nitride semiconductor, and a method for manufacturing the semiconductor device.

Conventionally, a III-V nitride semiconductor such as gallium nitride (GaN) has been widely used as a material for an active layer of an optical device since it has a direct transition energy band structure and a wide band gap. Recently, since the III-V nitride semiconductor is characteristically high in breakdown field intensity and high in electron saturation velocity, use of this III-V nitride semiconductor to a high frequency and high power electron device has been considered.

Among electron devices using the nitride semiconductor, development of a heterojunction field effect transistor (hereinafter, "HFET"), in particular has been considered.

Examples of the HFET device using the III-V nitride semiconductor include an HFET device constituted so that a GaN layer and an aluminum gallium nitride (AlGaN) layer are formed on a semi-insulating substrate by epitaxial growth, and so that a gate electrode that is a Schottky electrode and a source electrode and a drain electrode that are ohmic electrodes are provided on the AlGaN layer. In this HFET device, a two-dimensional electron gas layer (hereinafter, "2DEG layer") is formed near an interface of the GaN layer with the AlGaN layer and the 2DEG layer is employed as a high electron mobility channel region.

Nevertheless, because of presence of a high density trap level on a surface of the III-V nitride semiconductor, carries are captured and emitted in traps on the surface of the AlGaN layer, with the result that a phenomenon of deterioration in high frequency characteristics or so-called frequency dispersion occurs.

To suppress this frequency dispersion, there are known a method for reducing a trap density on the surface of the AlGaN layer by covering a region between the gate electrode and the source electrode and a region between the gate electrode and the drain electrode on the surface of the AlGaN layer with a surface protection film consisting of silicon nitride (SiN), and a method for providing a surface protection film consisting of a low concentration n type GaN on the AlGaN layer, and forming the gate electrode interposing the surface protection film (see, for example, Japanese Patent Application Laid-Open No. 2002-359256).

If the surface protection film consisting of SiN is used, the trap density on the surface of the AlGaN layer can be reduced in lateral portions of the gate electrode. However, in a fringe region that is a lower side end of the gate electrode, surface charge influences the channel region, with the result that the frequency dispersion cannot be sufficiently suppressed. If the surface protection film consisting of low concentration n type GaN is used, a distance between the gate electrode and the channel region is increased by a thickness of the surface protection film, with the result that a mutual conductance (gm) of the HFET device is reduced.

Meanwhile, as the HFET device using a gallium arsenide (GaAs) based material, there is known an HFET device having a so-called spike-gate structure in which a convex portion having a V-shaped cross section is provided in a lower portion of the gate electrode so as to decrease the influence of the surface traps (see, for example, Japanese Patent Application Laid-Open No. 2001-102354, and H. Furukawa and six others, "High power-added efficiency and low distortion GaAs power FET employing spike-gate structure", Solid-State Electronics, Elsevier Science Ltd., 1997, Volume 41, No. 10, pp. 1599-1604).

FIG. 10 is a cross-sectional block diagram that depicts a conventional GaAs based HFET device including the spike-gate. As shown in FIG. 10, an n type GaAs layer 102 and high concentration n type GaAs layer 103 are formed on a substrate 101 in this order. A concave portion 102a having a V-shaped cross section is provided in an upper portion of the n type GaAs layer 102, and the high concentration n type GaAs layer 103 is formed into a recess so as to open the concave portion 102a and surroundings of the concave portion 102a. In the region formed in the recess of the high concentration n type GaAs layer 103 on the n type GaAs layer 102, a gate electrode 104 is provided to be filled into the concave portion 102a. In addition, a source electrode 105 and a drain electrode 106 are provided on the high concentration n type GaAs layer 103.

In the HFET device shown in FIG. 10, since the gate electrode 104 is provided to be filled into the concave portion 102a, a convex portion having a V-shaped cross section is provided on a bottom side of the gate electrode 104 (that is, on a bottom of the concave portion 102a). A depth of the concave portion 102a is set so that the convex portion provided on the bottom side of the gate electrode 104 substantially functions as a gate.

By doing so, as compared with an ordinary recess structure, a gap between an upper surface of the n type GaAs layer 102 and the channel region can be set wide. It is, therefore, possible to decrease the influence of the traps on the upper surface of the n type GaAs layer 102 on the channel region, and suppress the frequency dispersion resulting from the traps on the surface of the n type GaAs layer 102.

In order to form the gate electrode 104 having such a structure, the concave portion 102a is formed using an anisotropic etchant having different etch rates according to plane orientations. Specifically, the concave portion 102a inclined at about 54.7 degrees with respect to the upper surface of the n type GaAs layer 102 is formed by wet etching using an etchant having an etch rate on a (100) plane of GaAs higher than an etch rate on a (111) plane. The concave portion 102a is formed into a recess in a [100] direction of the crystal plane, having a (111) plane of GaAs as an inclined surface, and having a V-shaped cross section.

However, if the spike-gate structure of the conventional GaAs based HFET device is applied to the HFET device using the III-V nitride semiconductor, it is difficult to form a minute concave portion in the upper portion of the III-V nitride semiconductor layer. This is because crystals of the III-V nitride semiconductor are chemically stable and no orientation dependent anisotropic wet etching appropriate for this HFET device is present.

As can be seen, the HFET device using the III-V nitride semiconductor has the following disadvantages. Since it is difficult to form the gate electrode having the concave portion on the bottom side of the spike-gate or the like, the influence of the traps on the upper surface of the III-V nitride semiconductor layer on the channel region cannot be sufficiently decreased. Hence, the frequency dispersion inhibits obtaining good high frequency characteristics.

SUMMARY OF THE INVENTION

In view of the above-mentioned conventional disadvantages, the present invention has been devised for the purpose of realizing a semiconductor device using a III-V nitride semiconductor capable of ensuring suppressing frequency dispersion resulting from surface traps on a surface of a III-V nitride semiconductor layer.

To attain the object, the present invention provides a constitution in which a concave portion is formed in a region, in which a gate electrode is formed, in a III-V nitride semiconductor layer by dry etching.

Specifically, according to a first aspect of the present invention, there is provided a semiconductor device, comprising: a III-V nitride semiconductor layer including a channel region in which carriers travel; a concave portion provided in an upper portion of the channel region in the III-V nitride semiconductor layer; and a Schottky electrode consisting of a conductive material forming a Schottky junction with the semiconductor layer, and formed on a semiconductor layer, which spreads over the concave portion and peripheral portions of the concave portion, on the III-V nitride semiconductor layer, wherein a dimension of the concave portion in a depth direction is set so that a portion of the Schottky electrode provided in the concave portion can adjust a quantity of the carriers traveling in the channel region.

In the semiconductor device of the present invention, the portion of the Schottky electrode formed in the concave portion can be used as a substantial gate electrode of a transistor. Due to this, the Schottky electrode can be formed so that the upper surface of the III-V nitride semiconductor layer is away from the channel region by the depth of the concave portion. In addition, it is possible to decrease the influence of traps present on the upper surface of the III-V nitride semiconductor layer, on the channel region. It is, therefore, possible to ensure suppressing frequency dispersion. Besides, since the portion of the Schottky electrode provided in the concave portion is used as the substantial gate electrode, a substantial gate length is substantially equal to a width of a bottom of the concave portion. Therefore, the gate length is reduced and the semiconductor device can operate at high rate.

It is preferable that the semiconductor device of the present invention further comprises a film provided between the III-V nitride semiconductor layer and the Schottky electrode so as to open an upper side of the concave portion.

By so constituting, since the Schottky electrode is provided on the III-V nitride semiconductor layer interposing the film, a trap density on the upper surface of the III-V nitride semiconductor layer can be reduced. It is, therefore, possible to obtain the semiconductor device that can further suppress the frequency dispersion and that has good high frequency characteristics.

In the semiconductor device of the present invention, it is preferable that the concave portion is provided so that an opening dimension is smaller from an upper surface side of the III-V nitride semiconductor layer toward a bottom side of the III-V nitride semiconductor layer.

By so constituting, the bottom of the concave portion can be further made small, and the substantial gate length can be, therefore, further reduced.

In the semiconductor device of the present invention, it is preferable that the concave portion is provided so that the opening dimension is linearly changed.

In this case, it is preferable that the semiconductor device further comprises a film consisting of a crystalline material and provided between the III-V nitride semiconductor layer and the Schottky electrode so as to open an upper side of the concave portion.

In the semiconductor device of the present invention, it is preferable that the concave portion is provided so that the opening dimension is nonlinearly changed.

In this case, it is preferable that the semiconductor device further comprises a film consisting of an amorphous material and provided between the III-V nitride semiconductor layer and the Schottky electrode so as to open an upper side of the concave portion.

According to a second aspect of the present invention, there is provided a method for manufacturing a semiconductor device comprising steps of: sequentially forming a III-V nitride semiconductor layer and a concave portion transfer film on a substrate; forming a first concave portion in the concave portion transfer film; and etching the concave portion transfer film by a predetermined depth using etching capable of etching the III-V nitride semiconductor layer and the concave portion transfer film, and thereby forming a second concave portion that has an equivalent shape to a shape of the first concave portion, below the first concave portion in the III-V nitride semiconductor layer.

According to the method for manufacturing the semiconductor device of the present invention, it is possible to ensure that the second concave portion having a desired depth is formed in the region in which the gate electrode is formed on the III-V nitride semiconductor layer based on the shape of the first concave portion formed in the concave portion transfer film. Accordingly, by forming the Schottky electrode to be filled into the second concave portion, the portion of the Schottky electrode filled into the second concave portion can be used as a substantial gate electrode. It is, therefore, possible to ensure obtaining the semiconductor device that can decrease the influence of traps present on the upper surface of the III-V nitride semiconductor layer, on the channel region, and that can suppress frequency dispersion In the method for manufacturing the semiconductor device of the present invention, it is preferable that the concave portion transfer film consists of a crystalline material, and that the step of forming the first concave portion includes steps of: forming a first mask pattern that includes an opening portion in a region in which the first concave portion is formed, on the concave portion transfer film; and removing a part of the concave portion transfer film which part is exposed to the opening portion of the first mask pattern by a predetermined depth by anisotropic etching.

By doing so, the first concave portion can be etched into a desired shape according to a crystal structure of the concave portion transfer film by orientation dependent anisotropic etching. The second concave portion can be, therefore, formed while controlling the shape of the concave portion according to the shape of the first concave portion.

In the method for manufacturing the semiconductor device of the present invention, as the crystalline material, one of gallium arsenide, silicon, silicon carbide, gallium phosphide, and diamond can be used.

If one of these materials is used, the first concave portion is formed to have the V-shaped cross section by the orientation dependent anisotropic etching. The second concave portion having the V-shaped cross section can be, therefore, formed.

In the method for manufacturing the semiconductor device of the present invention, it is preferable that the concave portion transfer film contains impurities consisting of a group IV element or a group V element.

By doing so, even if atoms that constitute the III-V nitride semiconductor layer are inadvertently diffused into the concave portion transfer film, the group IV impurities or group V impurities can compensate for the reduction in the resistance of the III-V nitride semiconductor layer. Accordingly, even if the concave portion transfer film consisting of silicon is used, the concave portion transfer film can be formed so as not to reduce the resistance of the III-V nitride semiconductor layer.

It is preferable that the method for manufacturing the semiconductor device of the present invention comprises a step, after the step of forming the second concave portion, of conducting a heat treatment to the III-V nitride semiconductor layer under conditions of a temperature of 300° C. or more and 1500° C. or less.

By doing so, the crystal defects generated on the III-V nitride semiconductor layer by the etching for forming the second concave portion can be eliminated by the heat treatment. The reliability of the semiconductor device can be, therefore, improved.

In the method for manufacturing the semiconductor device of the present invention, it is preferable that at the step of forming the second concave portion, an etching depth of the etching on the concave portion transfer film is set so that the concave portion transfer film remains on an upper surface of the III-V nitride semiconductor layer, and that the method further comprises steps of: forming a second mask pattern that covers the second concave portion and peripheral portions of the second concave portion, on the concave portion transfer film after the step of forming the second concave portion; and forming a film that covers the peripheral portions of the second concave portion from the concave portion transfer film by etching using the second mask pattern.

By doing so, the film is formed on the upper surface of the III-V nitride semiconductor layer. Due to this, by forming the Schottky electrode on the film to be filled into the second concave portion, the trap density in both side portions of the Schottky electrode on the upper surface of the III-V nitride semiconductor layer can be reduced. It is, therefore, possible to further ensure suppressing the frequency dispersion.

It is preferable that the method for manufacturing the semiconductor device of the present invention further comprises a step, between the step of forming the second concave portion and the step of forming the film, of conducting a heat treatment to the III-V nitride semiconductor layer at a temperature of 300° C. or more and 1500° C. or less.

By doing so, the heat treatment can be conducted in a state in which the surface of the III-V nitride semiconductor layer is covered with the concave portion transfer film. The crystal defects of the III-V nitride semiconductor layer can be, therefore, eliminated while suppressing the thermal oxidation of the surface of the III-V nitride semiconductor layer.

In the method for manufacturing the semiconductor device of the present invention, as the crystalline material that constitutes the concave portion transfer film, one of silicon, silicon carbide, gallium phosphide, and diamond can be used.

If one of these materials is used, since the concave portion transfer film is constituted by a high heat resistant material, at the heat treatment step of eliminating the crystal defects of the III-V nitride semiconductor layer, it is possible to ensure suppressing degeneration, transformation, or the like of the III-V nitride semiconductor layer due to the heat on the surface thereof.

In the method for manufacturing the semiconductor device of the present invention, it is preferable that the concave portion transfer film contains impurities consisting of a group IV element or a group V element.

If the concave portion is transferred onto the III-V nitride semiconductor layer by the dry etching, group III gallium (Ga) mixed into the concave portion transfer film during crystal growth on the concave portion transfer film is diffused into the concave portion transfer film to thereby reduce the specific resistance of the concave portion transfer film when the concave portion transfer film is left and used as a surface film. Due to this, the portion into which gallium is diffused acts as a leak current path from the gate electrode. However, by thus adding the group IV element or the group V element to the concave portion transfer film, the group III gallium is compensated (cancelled) and the resistance of the concave portion transfer film is increased. The gate leak current can be thereby suppressed.

It is preferable that the method for manufacturing the semiconductor device of the present invention further comprises a step, after the step of forming the second concave portion, of oxidizing, nitriding, or oxynitriding a surface of the concave portion transfer film.

By doing so, the film formed from the concave portion transfer film is in a state in which an oxide film, a nitride film, or an oxynitride film is formed on an upper portion of the film and the film can be formed to have high resistance. It is, therefore, possible to obtain the semiconductor device which can suppress the leak current from the gate electrode.

In the method for manufacturing the semiconductor device of the present invention, it is preferable that the concave portion transfer film consists of an amorphous material or a polycrystalline material, and that the step of forming the first concave portion includes steps of: forming a first mask pattern that includes an opening portion in a region in which the first concave portion is formed, on the concave portion transfer film; and removing a part of the concave portion transfer film which part is exposed to the opening portion of the first mask pattern by a predetermined depth by isotropic etching.

By doing so, the first concave portion can be formed so that the opening dimension is nonlinearly smaller toward the depth direction by the isotropic etching.

In the method for manufacturing the semiconductor device of the present invention, as the amorphous material, one of amorphous silicon, silicon oxide, silicon nitride, silicon carbide, and a III-V nitride semiconductor can be used.

In the method for manufacturing the semiconductor device of the present invention, as the polycrystalline material, one of silicon, silicon carbide, gallium phosphide, diamond, and a III-V nitride semiconductor can be used.

In the method for manufacturing the semiconductor device of the present invention, it is preferable that at the step of forming the second concave portion, an etching depth of the etching on the concave portion transfer film is set so that the concave portion transfer film remains on an upper surface of the III-V nitride semiconductor layer, and that the method further comprises steps of: forming a second mask pattern that covers the second concave portion and peripheral portions of the second concave portion, on the concave portion transfer film after the step of forming the second concave portion; and forming a film that covers the peripheral portions of the second concave portion from the concave portion transfer film by etching using the second mask pattern.

It is preferable that the method for manufacturing the semiconductor device of the present invention further comprises a step, between the step of forming the second concave portion and the step of forming the film, of conducting a heat treatment to the III-V nitride semiconductor layer at a temperature of 300° C. or more and 1500° C. or less.

In the method for manufacturing the semiconductor device of the present invention, it is preferable that the concave portion transfer film contains impurities consisting of a group IV element or a group V element.

It is preferable that the method for manufacturing the semiconductor device of the present invention further comprises a step, after the step of forming the second concave portion, of oxidizing, nitriding, or oxynitriding a surface of the concave portion transfer film.

BRIEF DESCRIPTION OF THE DRAWINGS

FIGS. 3A to 3D are cross-sectional block diagrams that depict a method for manufacturing the III-V nitride semiconductor device in the second embodiment of the present invention in order of steps;

FIGS. 5A to 5D are cross-sectional block diagrams that depict a method for manufacturing the III-V nitride semiconductor device in the third embodiment of the present invention in order of steps;

FIGS. 7A to 7D are cross-sectional block diagrams that depict a method for manufacturing the III-V nitride semiconductor device in the fourth embodiment of the present invention in order of steps;

FIGS. 9A to 9D are cross-sectional block diagrams that depict a method for manufacturing the III-V nitride semiconductor device in the fifth embodiment of the present invention in order of steps;

DETAILED DESCRIPTION OF THE INVENTION

Embodiment 1

A III-V nitride semiconductor device in the first embodiment of the present invention will be described with reference to the drawings. In the present specification, the III-V nitride semiconductor is a hybrid semiconductor including one of or two or more of boron nitride (BN), aluminum nitride (AlN), gallium nitride (GaN), and indium nitride (InN), and represented by a general formula of $B_xAl_yGa_zIn_{1-x-y}N$ (where $0 \leq x \leq 1$, $0 \leq y \leq 1$, and $0 \leq z \leq 1$).

Figure 1A:
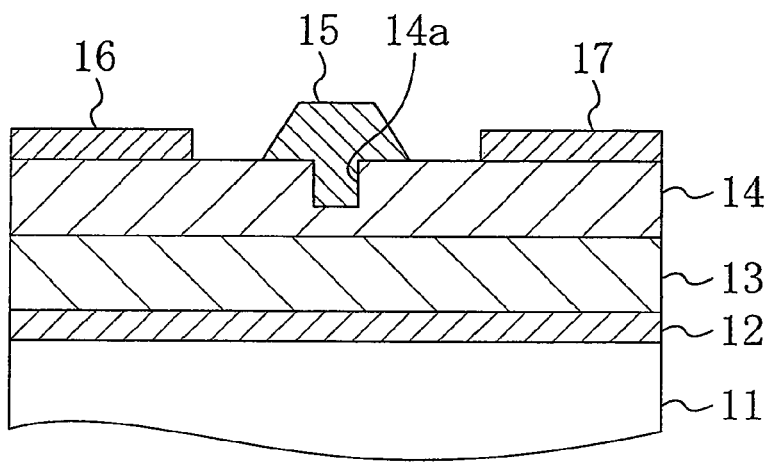
FIG. 1A is a cross-sectional block diagram of a III-V nitride semiconductor device in the first embodiment of the present invention.

FIG. 1A is a cross-sectional block diagram of the III-V nitride semiconductor device in the first embodiment of the present invention. As shown in FIG. 1A, the III-V nitride semiconductor device is constituted so that, for example, a buffer layer 12 having a thickness of about 10 nm to 200 nm and consisting of aluminum nitride (AlN), a channel layer 13 having a thickness of about 2 μm to 3 μm and consisting of undoped gallium nitride (GaN), and a carrier supply layer 14 having a thickness of about 20 nm to 30 nm and consisting of n type aluminum gallium nitride (AlGaN) are formed on a substrate 11 consisting of silicon carbide (SiC) in this order. The thicknesses of the buffer layer 12, the channel layer 13, and the carrier supply layer 14 are given as one example. The thickness of the channel layer 13 may be set so that channel layer 13 has good crystallinity and may be, for example, at least about 1 μm.

A concave portion 14a is provided in an upper portion of the carrier supply layer 14, and a gate electrode 15 which consists of a metallic material and in which a Schottky junction with the carrier supply layer 14 is formed is provided on the carrier supply layer 14 to be filled into the concave portion 14a. A depth of the concave portion 14a is preferably 20 nm or less, more preferably about 10 nm to 15 nm if the thickness of the carrier supply layer 14 is, for example, 25 nm. In this case, the HFET device according to this embodiment can operate at a frequency of 2 GHz.

A source electrode 16 and a drain electrode 17 each consisting of a metallic material and forming an ohmic contact with the carrier supply layer 14 are provided laterally of the gate electrode 15, respectively, on the carrier supply layer 14 at a predetermined distance between the source electrode 16 and the drain electrode 17. As the gate electrode 15, a multilayer film consisting of nickel (Ni) and gold (Au) or a monolayer film consisting of palladium (Pd) or palladium silicon (PdSi) can be used. As the source electrode 16 or the drain electrode 17, a multilayer film consisting of titanium (Ti) and aluminum (Al) can be used.

The III-V nitride semiconductor device in the first embodiment functions as an HFET having a 2DEG layer formed near an interface of the channel layer 13 with the carrier supply layer 14 by a heterojunction between the channel layer 13 and the carrier supply layer 14. By applying a predetermined operating voltage Vds to the source electrode 16 and the drain electrode 17, electrons in quantities corresponding to a potential of the gate electrode 15 travel on the 2DEG layer.

In the III-V nitride semiconductor device in the first embodiment, by appropriately adjusting the depth of the concave portion 14a, a convex portion provided on a bottom side of the gate electrode 15, i.e., a portion of the gate electrode 15 filled into the concave portion 14a substantially functions as a gate electrode.

A first threshold voltage Vth1 is proportional to a distance from a lower end of the concave portion 14a to an upper surface of the channel layer 13, and a second threshold voltage Vth2 is proportional to a thickness of the carrier supply layer 14. By adjusting the depth of the concave portion 14a according to the thickness of the carrier supply layer 14, therefore, the threshold voltages Vth1 and Vth2 can be set at appropriate values.

By thus constituting the III-V nitride semiconductor device, even if a distance from the upper surface of the carrier supply layer 14 to the channel region (2DEG layer) is set large, the quantity of carriers traveling in the channel region can be adjusted using the portion of the gate electrode 15 formed in the concave portion 14a. Accordingly, as long as the distance from the bottom of the concave portion 14a to the channel region is equal to the distance from the upper surface of the flat carrier supply layer to the channel region, it is possible to decrease the influence of traps between the upper surface of the carrier supply layer 14 and the bottom of the gate electrode 15 on the channel region by as much as the depth of the concave portion 14a, as compared with the conventional configuration in which the gate electrode is provided on the upper surface of the flat carrier supply layer. Therefore, frequency dispersion can be suppressed and high frequency characteristics can be improved.

In the III-V nitride semiconductor device in the first embodiment, the concave portion 14a can be formed by performing dry etching on the carrier supply layer 14, the surface of which is formed flat by epitaxial growth, using a mask pattern provided to open a region in which the concave portion 14a is formed by an etching gas consisting of chlorine ($Cl_2$) and sulfur hexafluoride ($SF_6$). By using this etching gas, the carrier supply layer 14 consisting of AlGaN can be etched at an etch rate of about 0.1 nm to 100 nm per minute, and it is possible to ensure forming the concave portion 14a while controlling the depth of the concave portion 14a.

Modification 1 of Embodiment 1

Figure 1B:
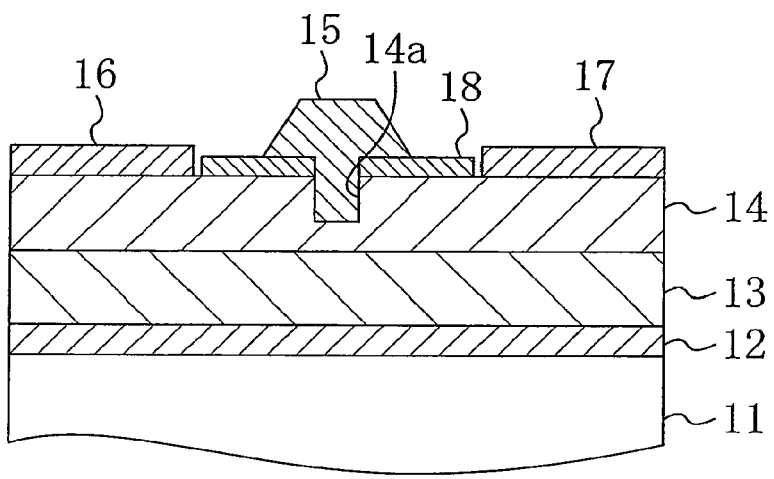
FIG. 1B is a cross-sectional block diagram of a III-V nitride semiconductor device in the first modification of the first embodiment of the present invention.

FIG. 1B is a cross-sectional block diagram of a III-V nitride semiconductor device in the first modification of the first embodiment of the present invention. As shown in FIG. 1B, the III-V nitride semiconductor device in the first modification is constituted so that a protection film 18 having a thickness of about 100 nm to 200 nm and consisting of silicon oxide or silicon nitride is provided in a region between the concave portion 14a and each of the source electrode 16 and the drain electrode 17 on the upper surface of the carrier supply layer 14.

According to the first modification of the first embodiment, since the protection film 18 is provided on the upper surface of the carrier supply layer 14, a trap density in both side portions of the gate electrode 15 on the upper surface of the carrier supply layer 14 can be reduced. It is, therefore, possible to further ensure suppressing the frequency dispersion resulting from the traps on the upper surface of the carrier supply layer 14, as compared with the first embodiment.

In the configuration shown in FIG. 1B, a material for the protection film 18 is not limited to silicon oxide or silicon nitride but may be the other insulating material, a single crystal silicon, amorphous silicon, gallium arsenide (GaAs), or the like.

Modification 2 of Embodiment 1

Figure 1C:
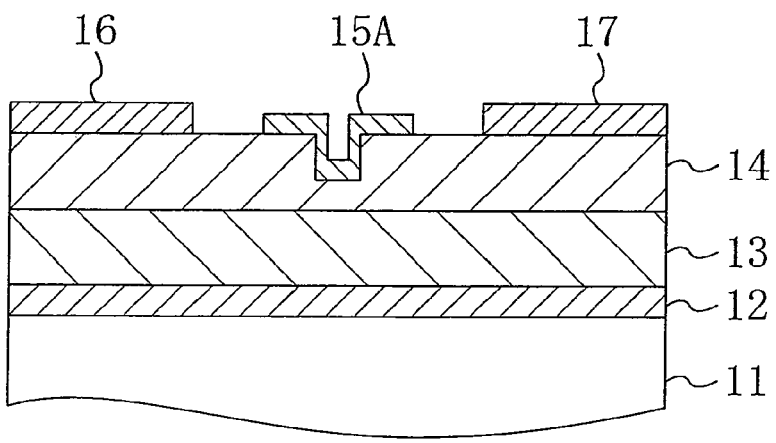
FIG. 1C is a cross-sectional block diagram of a III-V nitride semiconductor device in the second modification of the first embodiment of the present invention.

FIG. 1C is a cross-sectional block diagram of a III-V nitride semiconductor device in the second modification of the first embodiment of the present invention. As shown in FIG. 1C, the III-V nitride semiconductor device in the second modification is constituted so that a gate electrode 15A formed in the concave portion 14a, which is provided on the upper surface of the carrier supply layer 14, and serving as a Schottky electrode is provided not to be filled into the concave portion 14a but to extend along a bottom and a wall surface of the concave portion 14a and peripheral portions of the concave portion 14a. Since the gate electrode 15A is not filled into the concave portion 14a, an amount of a material used for the gate electrode 15A can be reduced and a throughput of a step of forming the gate electrode 15A can be improved.

Embodiment 2

A III-V nitride semiconductor device in the second embodiment of the present invention will be described hereinafter with reference to the drawings.

Figure 2A:
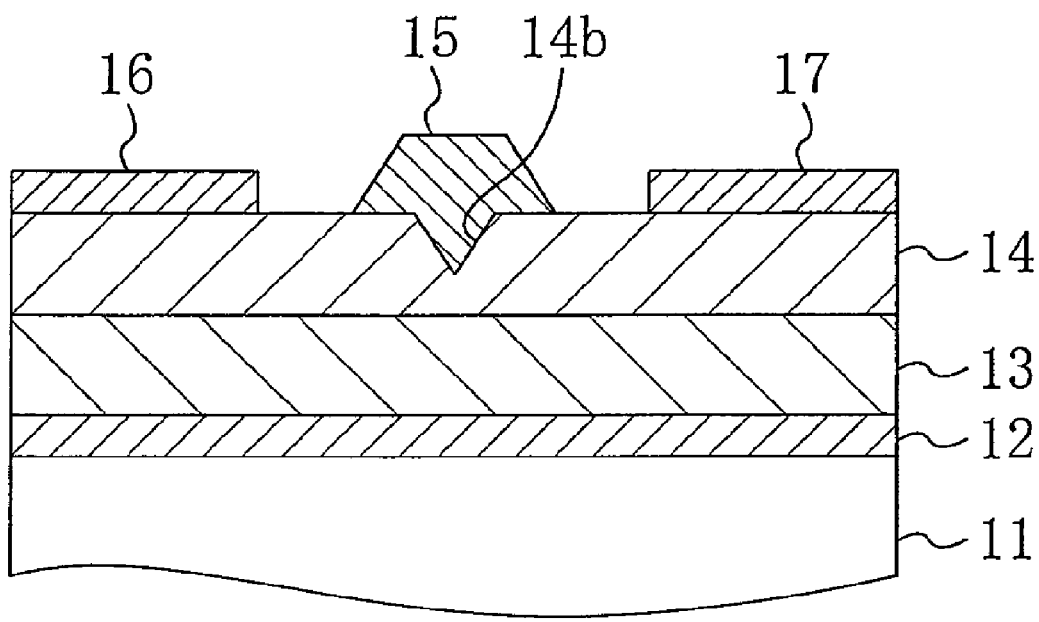
FIG. 2A is a cross-sectional block diagram of a III-V nitride semiconductor device in the second embodiment of the present invention.

FIG. 2A is a cross-sectional block diagram of the III-V nitride semiconductor device in the second embodiment of the present invention. In FIG. 2A, same components as those shown in FIGS. 1A to 1C are denoted by the same reference symbols, respectively, and will not be repeatedly described herein.

As shown in FIG. 2A, the III-V nitride semiconductor device in the second embodiment of the present invention is constituted so that a buffer layer 12 consisting of AlN, a channel layer 13 consisting of undoped GaN, and a carrier supply layer 14 consisting of AlGaN are formed on a substrate 11 consisting of SiC in this order, and so that a concave portion 14b having a V-shaped cross section is formed in an upper portion of the carrier supply layer 14.

A gate electrode 15 is provided on the carrier supply layer 14 to be filled into the concave portion 14a. A source electrode 16 and a drain electrode 17 are provided laterally of the gate electrode 15, respectively, on the carrier supply layer 14 at a predetermined distance between the source electrode 16 and the drain electrode 17. Similarly to the first embodiment, a depth of the concave portion 14b is set so that a portion of the gate electrode 15 provided in the concave portion 14b substantially functions as a gate electrode.

According to the III-V nitride semiconductor device in the second embodiment, similarly to the III-V nitride semiconductor device in the first embodiment, the portion of the gate electrode 15 provided in the concave portion 14b can be used as the substantial gate electrode. Due to this, it is possible to decrease the influence of traps present on the upper surface of the carrier supply layer 14, on the channel region by as much as the depth of the concave portion 14b. It is, therefore, possible to ensure suppressing frequency dispersion resulting from the traps on the upper surface of the carrier supply layer 14.

Furthermore, the concave portion 14b is formed to have the V-shaped cross-section, that is, formed so that an opening dimension is linearly smaller from the upper surface side of the carrier supply layer 14 toward the depth direction. Due to this, an effective gate length of the gate electrode 15 can be set far smaller than that of the gate electrode 15 in the first embodiment, while using a normally used pattern formation technique. The III-V nitride semiconductor device in the second embodiment can, therefore, operate at high rate.

Modification of Embodiment 2

Figure 2B:
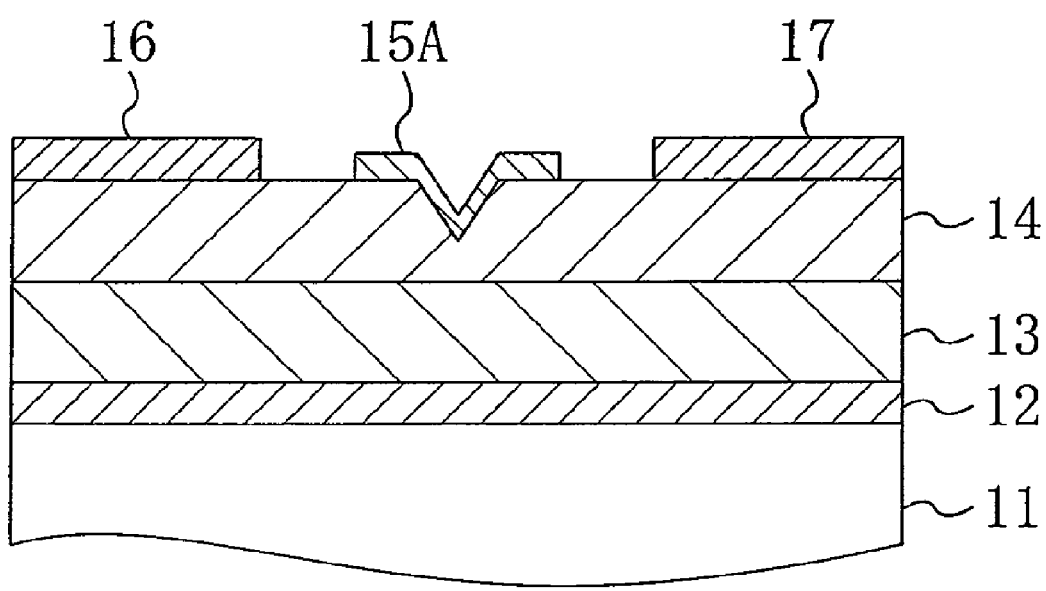
FIG. 2B is a cross-sectional block diagram of a III-V nitride semiconductor device in one modification of the second embodiment of the present invention.

FIG. 2B is a cross-sectional block diagram of a III-V nitride semiconductor device in one modification of the second embodiment of the present invention. As shown in FIG. 2B, the III-V nitride semiconductor device in this modification is constituted so that a gate electrode 15A formed in the concave portion 14b, which has the V-shaped cross section and provided on the upper surface of the carrier supply layer 14, and serving as a Schottky electrode is provided not to be filled into the concave portion 14b but to extend along an inclined surface of the concave portion 14a and peripheral portions of the concave portion 14b. Since the gate electrode 15A is not filled into the concave portion 14b, an amount of a material used for the gate electrode 15A can be reduced and a throughput of a step of forming the gate electrode 15A can be improved.

A method for manufacturing the III-V nitride semiconductor device in the second embodiment of the present invention will now be described with reference to the drawings.

FIGS. 3A to 3D are cross-sectional block diagrams that depict the method for manufacturing the III-V nitride semiconductor device in the second embodiment of the present invention in order of steps.

As shown in FIG. 3A, the buffer layer 12 consisting of AlN, the channel layer 13 consisting of undoped GaN, the carrier supply layer 14 consisting of n type AlGaN, a so-called low temperature buffer layer 21 having a thickness of 15 nm to 20 nm and consisting of gallium arsenide (GaAs), and a concave portion transfer film 22 having GaAs subjected to crystal growth so that a plane orientation is a (100) plane are formed on the substrate 11 consisting of SiC in this order by growth using metal organic chemical vapor deposition (MOCVD) or molecular beam epitaxy (MBE). As a material for the low temperature buffer layer 21, GaAs grown into an amorphous state at a low temperature is used, whereby crystal lattice mismatching between the carrier supply layer 14 and the concave portion transfer film 22 can be relaxed. The material for the low temperature buffer layer 21 is not limited to GaAs grown at a low temperature but may be an arbitrary material which can relax the lattice mismatching between the carrier supply layer 14 and the concave portion transfer film 22.

A concave portion formation mask pattern 23 including an opening portion 23a a longitudinal direction of which is a [110] orientation of the crystal lattice of GaAs of the concave portion transfer film 22 and having an opening width of about 100 nm is formed on the concave portion transfer film 22 by lithography.

As shown in FIG. 3B, a transfer concave portion 22a is formed in the concave portion transfer film 22 exposed to the opening portion 23a of the mask pattern 23 by wet etching using a solution mixture of sulfuric acid ($H_2SO_4$) and hydrogen peroxide ($H_2O_2$) as an etchant. As the etchant, the solution mixture having a volume ratio of, for example, $H_2SO_4$:$H_2O_2$:$H_2O$=8:1:1 can be used.

The etchant consisting of $H_2SO_4$ and $H_2O_2$ exhibits crystal anisotropy relative to gallium arsenide crystals, and an etch rate of the etchant on the (111) plane is far lower than an etch rate on the (100) plane. Therefore, the transfer concave portion 22a is formed to have the (111) plane as an inclined surface and have a recess cross section in the [100] orientation, i.e., a V-shaped cross section.

As shown in FIG. 3C, after removing the mask pattern 23, an entire surface of the concave transfer film 22 is etched by a predetermined depth by dry etching using a gas mixture of chlorine ($Cl_2$) and sulfur hexafluoride ($SF_6$) as an etching gas.

Conditions for the dry etching on the concave transfer film 22 are as follows. A flow rate of $Cl_2$ is about 10 ml/min (in a standard condition), a flow rate of $SF_6$ is about 5 ml/min (in a standard condition), a reaction chamber pressure is about 4 Pa, a plasma output is about 600 W, and a substrate voltage is about 30 W. In the gas mixture used for the dry etching, boron trichloride ($BCl_3$) may be used in place of $Cl_2$.

The etching gas consisting of $Cl_2$ and $SF_6$ can etch GaAs and AlGaN. Therefore, by etching the concave transfer film 22 from the upper surface side, the low temperature buffer layer 21 and the carrier supply layer 14 are sequentially etched from the upper surface side below the transfer concave portion 22a, and the concave portion 14b having an equivalent V-shaped cross section to that of the transfer concave portion 22a is formed in the carrier supply layer 14. At this time, the depth of the concave portion 14b can be appropriately adjusted by adjusting an etching depth of the etching on the concave transfer film 22.

The concave portion 14b having the V-shaped cross section can be similarly formed in the carrier supply layer 14 even by an anisotropic physical method such as ion milling using argon (Ar) in place of the dry etching on the concave portion transfer film 22.

As shown in FIG. 3D, after sequentially removing the concave portion transfer film 22 and the low temperature buffer layer 21 by the wet etching, the source electrode 16 and the drain electrode 17 are formed laterally of the concave portion 14b on the carrier supply layer 14 using a metallic material which can form an ohmic contact with the carrier supply layer 14, with the distance kept between the source electrode 16 and the drain electrode 17, furthermore, the ohmic contact is formed through a heat treatment step. Thereafter, the gate electrode 15 is formed to be filled into the concave portion 14b using a metallic material that can form a Schottky junction with the carrier supply layer 14.

Through these steps, the III-V nitride semiconductor device in the second embodiment can be obtained.

According to the method for manufacturing the III-V nitride semiconductor device in the second embodiment, by forming the transfer concave portion 22a in the concave portion transfer film 22 consisting of GaAs and then dry-etching the concave portion transfer film 22, the concave portion 14b having the equivalent cross section to that of the transfer concave portion 22a can be formed in the carrier supply layer 14.

Further, during the etching for forming the concave portion 14b, an etch selectivity of the material (AlGaN) for the carrier supply layer 14 to the material (GaAs) for the concave portion transfer film 22 is controlled. It is thereby possible to ensure forming the concave portion 14b while controlling the shape of the concave portion 14b based on the shape of the transfer concave portion 22a. It is particularly preferable to set the etch selectivity at 1 or more so as to improve a pointedness of the concave portion 14b.

In the method for manufacturing the III-V nitride semiconductor device in the second embodiment, annealing can be performed under conditions of a temperature of 300° C. or more and 1500° C. or less after the dry etching step of forming the concave portion 14b and at least before the formation of the gate electrode 15, the source electrode 16, and the drain electrode 17. If so, crystal defects generated in the carrier supply layer 14 due to a damage of the dry etching can be eliminated. Reliability of the III-V nitride semiconductor device can be thereby improved.

In the method for manufacturing the III-V nitride semiconductor device in the second embodiment, the material for the concave portion transfer film 22 is not limited to GaAs but may be an arbitrary material with which the transfer concave portion 22a having the V-shaped cross section can be formed based on crystal anisotropy. For example, single-crystal silicon, SiC, gallium phosphide (GaP), or diamond can be used as the material for the concave portion transfer film 22. By using one of these materials, it is possible to ensure forming the concave portion 14b to have the V-shaped cross section by the crystal anisotropic wet etching.

It is more preferable that the material for the concave portion transfer film 22 is one of silicon, SiC, GaP, and diamond. If so, the concave portion transfer film 22 is constituted by the high heat resistant material. Due to this, the annealing performed to eliminate the crystal defects can be executed before the step of removing the concave portion transfer film 22. It is, therefore, possible to anneal the carrier supply layer 14 while the carrier supply layer 14 is hardly exposed.

Examples of the etchant for forming the transfer concave portion 22a having the V-shaped cross section if the material other than GaAs is used for the concave portion transfer film 22, will be shown according to the materials as follows. If silicon (Si) is the material for the concave portion transfer film 22, the transfer concave portion 22a can be formed by anisotropic wet etching using, as the etchant, a solution mixture of potassium hydroxide (KOH) and tetra-methyl ammonium hydroxide (TMAH) or by anisotropic dry etching using, as the etchant, chlorine ($Cl_2$) gas. If gallium phosphide (GaP) is the material for the concave portion transfer film 22, the transfer concave portion 22a can be formed by anisotropic wet etching using, as the etchant, a solution mixture of hydrogen bromide (HBr), hydrogen peroxide ($H_2O_2$), and water ($H_2O$) at a volume ratio of 1:1:3 or by anisotropic dry etching using an etchant mainly containing chlorine ($Cl_2$) gas. If silicon carbide (SiC) is the material for the concave portion transfer film 22, the transfer concave portion 22a can be formed by dry etching using, as the etchant, a gas mixture of chlorine ($Cl_2$) and sulfur hexafluoride ($SF_6$). If diamond (C) is the material for the concave portion transfer film 22, the transfer concave portion 22a can be formed by anisotropic dry etching using, as the etchant, a hydrogen chloride (HCl) gas.

It is noted that, in the first and second embodiments, the carrier supply layer 14 may have a layered structure composed of a first carrier supply layer 140 made of $Al_uGa_{1-u}N$ ($0 \leq u \leq 1$) and a second carrier supply layer 141 made of $Al_vGa_{1-v}N$ ($0 \leq v \leq 1$, $u \neq v$), as shown in FIG. 11A to FIG. 11C and FIG. 12A to FIG. 12B. With this structure, the first carrier supply layer 140 and the second supply layer 141 are different from each other in composition, resulting in difference from each other in etch rate in dry etching. Thus, the second carrier supply layer 141 is selectively etched out of the first carrier supply layer 140 and the second carrier supply layer 141

Embodiment 3

A III-V nitride semiconductor device in the third embodiment of the present invention will be described with reference to the drawings.

Figure 4:
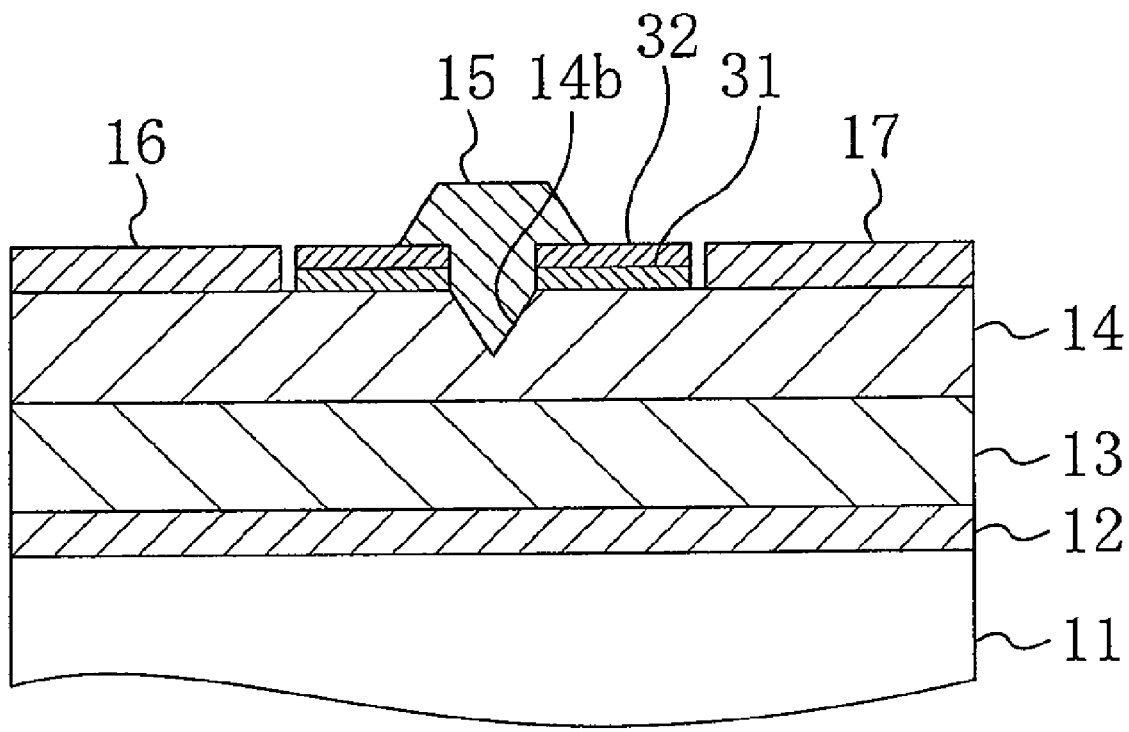
FIG. 4 is a cross-sectional block diagram of a III-V nitride semiconductor device in the third embodiment of the present invention.

FIG. 4 is a cross-sectional block diagram of the III-V nitride semiconductor device in the third embodiment of the present invention. In FIG. 4, same components as those shown in FIG. 2A are denoted by the same reference symbols, respectively, and will not be repeatedly described herein.

As shown in FIG. 4, the III-V nitride semiconductor device in the third embodiment is constituted so that a buffer layer 12 consisting of AlN, a channel layer 13 consisting of undoped GaN, and a carrier supply layer 14 consisting of n type AlGaN are formed on a substrate 11 consisting of SiC in this order, and so that a concave portion 14b having a V-shaped cross section is formed in the carrier supply layer 14.

In a region on an upper surface of the carrier supply layer 14 in which region a gate electrode 15 is formed, a low temperature buffer layer 31 consisting of silicon grown under a low temperature condition, and a protection film 32 consisting of single-crystal silicon are formed in this order so as to open the upper part of the concave portion 14b. The low temperature buffer layer 31 is provided to relax crystal lattice mismatching between the carrier supply layer 14 and the protection film 32.

The gate electrode 15 is formed on the protection film 32 so as to be filled into opening portions of the low temperature buffer layer 31 and the protection film 32 and the concave portion 14b. A source electrode 16 and a drain electrode 17 are formed in regions in which the low temperature buffer layer 31 and the protection film 32 are not formed on the upper surface of the carrier supply layer 14.

In the semiconductor device in the third embodiment, since the protection film 32 is provided on the carrier supply layer 14, a trap density can be reduced in both side portions of the gate electrode 15 on the upper surface of the carrier supply layer 14. It is, therefore, possible to further ensure suppressing the frequency dispersion resulting from the traps on the upper surface of the carrier supply layer 14, as compared with the second embodiment.

In the III-V nitride semiconductor device in the third embodiment, group IV impurities or group V impurities such as nitrogen (N), phosphorus (P), arsenic (As), antimony (Sb), or bismuth (Bi) impurities are preferably added to each of the low temperature buffer layer 31 and the protection film 32. By doing so, even if gallium or aluminum is inadvertently doped into the low temperature buffer layer 31 and the protection film 32 during crystal growth on the low temperature buffer layer 31 and the concave portion transfer film (=protection film 32), the group IV impurities or group V impurities contained in the low temperature buffer layer 31 and the protection film 32 can compensate for the inadvertently doped gallium or aluminum and the low temperature buffer layer 31 and the protection film 32 can be kept to have high resistance. Accordingly, even if the low temperature buffer layer 31 and the protection film 32 are formed using silicon, a gate leak current resulting from a reduction in specific resistance of protection film 32 does not occur.

It is also preferable that an upper portion of the protection film 32 is oxidized, nitrided, or oxynitrided. By doing so, the protection film 32 can be formed to have a high resistance and can be used as a low-leakage and high-reliability protection film.

Further, a material for the protection film 32 is not limited to silicon but may be GaAs, SiC, GaP, or diamond. If one of these materials is used as the material for the protection film 32, the material which can relax the lattice mismatching between the protection film 32 and the carrier supply layer 14 may be selected as the material for the low temperature buffer layer 31.

A method for manufacturing the III-V nitride semiconductor device in the third embodiment of the present invention will now be described with reference to the drawings.

FIGS. 5A to 5D are cross-sectional block diagrams that depict the method for manufacturing the III-V nitride semiconductor device in the third embodiment of the present invention in order of steps. In FIGS. 5A to 5D, same components as those shown in FIGS. 3A to 3D are denoted by the same reference symbols, respectively, and will not be repeatedly described herein.

As shown in FIG. 5A, the buffer layer 12 consisting of AlN, the channel layer 13 consisting of undoped GaN, the carrier supply layer 14 consisting of n type AlGaN, the low temperature buffer layer 41 having silicon grown under the low temperature condition, and a concave portion transfer film 42 having silicon subjected to crystal growth so that a plane orientation is a (100) plane are formed on the substrate 11 in this order using MOCVD or MBE. A concave portion formation mask pattern 23 including an opening portion 23a a longitudinal direction of which is a [110] orientation of the crystal lattice of silicon of the concave portion transfer film 42 is formed on the concave portion transfer film 42 by lithography.

At the crystal growth step shown in FIG. 5A, a reduction in the specific resistance of the concave portion transfer film 42 sometimes disadvantageously occurs due to inadvertent doping of gallium or aluminum into the low temperature buffer layer 41 and the concave portion transfer film 42. To avoid this, the low temperature buffer layer 41 and the concave portion transfer film 42 may be formed while adding thereto group IV impurities or group V impurities. By doing so, the group IV impurities or group V impurities can prevent the specific resistance of the concave portion transfer film 42 from being reduced by the inadvertent doping of gallium or aluminum.

As shown in FIG. 5B, a transfer concave portion 42a is formed in the concave portion transfer film 42 exposed to the opening portion 23a of the mask pattern 23 by wet etching using a solution mixture of potassium hydroxide (KOH) and propyl alcohol as an etchant. As the etchant, the solution mixture having a volume ratio of, for example, KOH:propyl alcohol:$H_2O$=23.4:13.3:63.3 can be used.

The etchant consisting of KOH and propyl alcohol exhibits crystal anisotropy relative to silicon crystals, and an etch rate of the etchant on the (111) plane is far lower than an etch rate on the (100) plane. Therefore, the transfer concave portion 42a is formed to have the (111) plane as an inclined surface and have a V-shaped cross section.

As shown in FIG. 5C, after removing the mask pattern 23, an entire surface of the concave transfer film 22 is etched by dry etching using a gas mixture of chlorine ($Cl_2$) and sulfur hexafluoride ($SF_6$) as an etching gas, thereby forming the concave portion 14b in the carrier supply layer 14. A mask pattern 43 that covers a region including the concave portion 14b and peripheral portions of the concave portion 14b is formed on the concave portion transfer film 22.

As shown in FIG. 5D, by sequentially removing exposed parts of the concave portion transfer film 42 and the low temperature buffer layer 41 by the etching using the mask pattern 43, the protection film 42a is formed out of the concave portion transfer film 42. After removing the mask pattern 43, the source electrode 16 and the drain electrode 17 are formed laterally of the concave portion 14b using a metallic material which can form an ohmic contact with the carrier supply layer 14, with the distance kept between the source electrode 16 and the drain electrode 17 and the ohmic contact is formed through a heat treatment step. Thereafter, the gate electrode 15 is formed to be filled into the concave portion 14b using a metallic material that can form a Schottky junction with the carrier supply layer 14.

Through these steps, the semiconductor device in the third embodiment can be obtained.

According to the method for manufacturing the III-V nitride semiconductor device in the third embodiment, since the protection film 42A is formed out of the concave portion transfer film 42, the upper surface of the carrier supply layer 14 is not exposed during manufacturing of the III-V nitride semiconductor device. A crystal interface on the upper surface side of the carrier supply layer 14 can be, therefore, kept in a favorable condition.

In the method for manufacturing the III-V nitride semiconductor device in the third embodiment, after the steps of forming the gate electrode 15, the source electrode 16, and the drain electrode 17, the upper portion of the protection film 42A may be, for example, oxidized or nitrided by plasma oxidation or plasma nitriding or may be oxynitrided by the plasma oxidation and the plasma nitriding. By doing so, the resistance of the protection film 42A can be increased and the reliability of the protection film 42A can be improved.

It is noted that execution of the step of oxidizing the upper portion of the protection film 42A is not limited to a timing after the formation of the gate electrode 15, the source electrode 16, and the drain electrode 17 but may be after the formation of the concave portion 14b and before the step of forming the protection film 42A out of the concave portion transfer film 42. In addition, at the step of oxidizing the upper portion of the protection film 42A, a silicon nitride film may be selectively formed to cover the concave portion 14b, an entire surface of the concave portion transfer film 42 may be thermally oxidized, and the protection film 42A may be formed out of the thermally oxidized concave portion transfer film 42.

Furthermore, in the method for manufacturing the III-V nitride semiconductor device in the third embodiment, annealing can be performed under conditions of a temperature of 300° C. or more and 1500° C. or less after the dry etching step of forming the concave portion 14b and before the step of forming the protection film 42A out of the concave portion transfer film 42. If so, crystal defects generated in the carrier supply layer 14 can be eliminated while the carrier supply layer 14 is covered with the concave portion transfer film 42. Reliability of the III-V nitride semiconductor device can be thereby improved.

In the method for manufacturing the III-V nitride semiconductor device in the third embodiment, the material for the concave portion transfer film 42 is not limited to single-crystal silicon but may be an arbitrary material with which the transfer concave portion 42a having the V-shaped cross section can be formed based on crystal anisotropy. For example, SiC, GaP, or diamond can be used as the material for the concave portion transfer film 42. By using one of these materials, similarly to use of single-crystal silicon, the concave portion 14b having the V-shaped cross section based on the crystal anisotropy can be formed in the concave portion transfer film 42. It is, therefore, possible to ensure forming the concave portion 14b having the V-shaped cross section in the carrier supply layer 14. Besides, since SiC, GaP, and diamond have high heat resistance, the crystal defects on the carrier supply layer 14 can be eliminated by the annealing while covering the carrier supply layer 14 with the concave portion transfer film 42.

Embodiment 4

A III-V nitride semiconductor device in the fourth embodiment of the present invention will be described with reference to the drawings.

Figure 6:
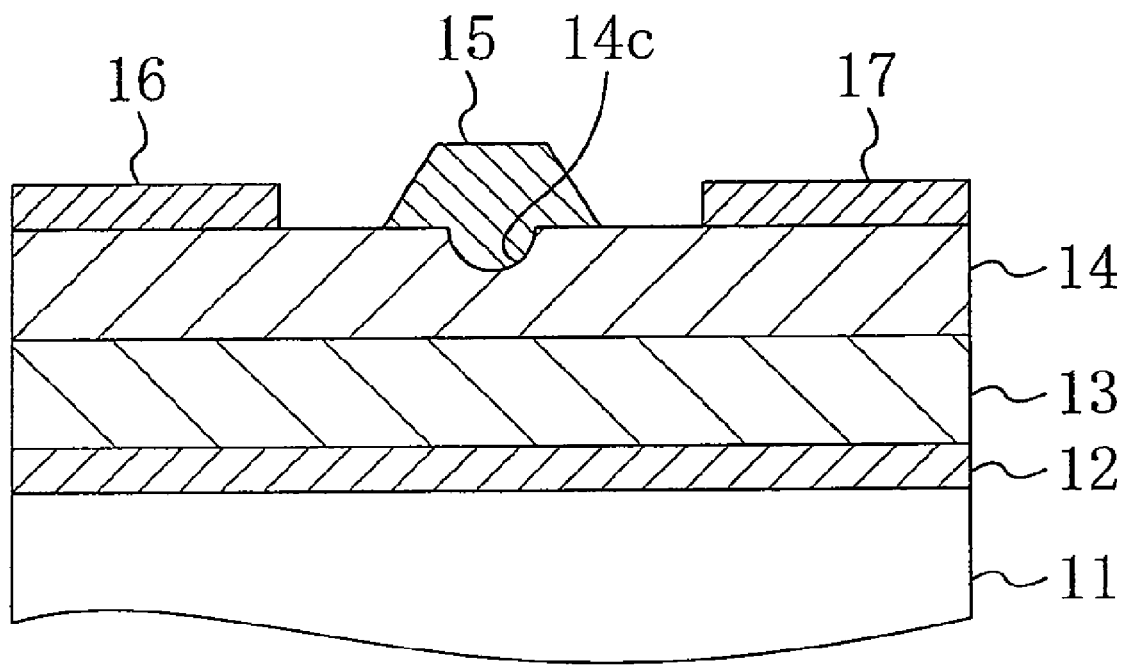
FIG. 6 is cross-sectional block diagram of a III-V nitride semiconductor device in the fourth embodiment of the present invention.

FIG. 6 is a cross-sectional block diagram of the III-V nitride semiconductor device in the fourth embodiment of the present invention. In FIG. 6, same components as those shown in FIG. 2A are denoted by the same reference symbols, respectively, and will not be repeatedly described herein.

As shown in FIG. 6, the III-V nitride semiconductor device in the fourth embodiment is constituted so that a buffer layer 12 consisting of AlN, a channel layer 13 consisting of undoped GaN, and a carrier supply layer 14 consisting of n type AlGaN are formed on a substrate 11 consisting of SiC in this order, and so that a concave portion 14c having a semi-circular cross section is provided in the carrier supply layer 14. A gate electrode 15 is formed on the carrier supply layer 14 so as to be filled into the concave portion 14. A source electrode 16 and a drain electrode 17 are formed laterally of the gate electrode 15 at a distance between the source electrode 16 and the drain electrode 17. A depth of the concave portion 14c is set so that a portion of the gate electrode 15 provided in the concave portion 14c substantially functions as a gate electrode, similarly to the first embodiment.

According to the III-V nitride semiconductor device in the fourth embodiment, similarly to the III-V nitride semiconductor device in the first embodiment, the portion of the gate electrode 15 provided in the concave portion 14c can be used as the substantial gate electrode. Due to this, it is possible to decrease the influence of traps present on the upper surface of the carrier supply layer 14, on the channel region by as much as the depth of the concave portion 14c. It is, therefore, possible to ensure suppressing frequency dispersion resulting from the traps on the upper surface of the carrier supply layer 14.

Furthermore, since the concave portion 14c is formed to have the semicircular cross-section, an effective gate length of the gate electrode 15 can be set small. The III-V nitride semiconductor device in the fourth embodiment can, therefore, operate at high rate. The cross-sectional shape of the concave portion 14c is not limited to the semicircular shape but may be an arbitrary shape as long as the concave portion 14c is formed so that an opening dimension is nonlinearly smaller from the upper surface side of the carrier supply layer 14 toward the depth direction. The cross-sectional shape of the concave portion 14c may be, for example, a U shape or a semielliptic shape.

A method for manufacturing the III-V nitride semiconductor device in the fourth embodiment of the present invention will now be described with reference to the drawings.

FIGS. 7A to 7D are cross-sectional block diagrams that depict the method for manufacturing the III-V nitride semiconductor device in the fourth embodiment of the present invention in order of steps. In FIGS. 7A to 7D, same components as those shown in FIGS. 3A to 3D are denoted by the same reference symbols, respectively, and will not be repeatedly described herein.

As shown in FIG. 7A, the buffer layer 12 consisting of AlN, the channel layer 13 consisting of undoped GaN, the carrier supply layer 14 consisting of n type AlGaN, and a concave portion transfer film 51 consisting of amorphous or polycrystalline silicon are formed on the substrate 11 in this order using MOCVD or MBE. A mask pattern 23 including an opening portion 23a is formed on the concave portion transfer film 51 by lithography.

At the step of forming the concave portion transfer film 51, the concave portion transfer film 51 consisting of amorphous silicon may be formed by, for example, vacuum deposition or sputtering instead of the MOCVD or the MBE.

As shown in FIG. 7B, a transfer concave portion 51a is formed in the concave portion transfer film 51 exposed to the opening portion 23a of the mask pattern 23 by performing an isotropic on the concave portion transfer film 51. By performing the isotropic etching on the concave portion transfer film 51, the transfer concave portion 51a can be formed so that the opening dimension is nonlinearly smaller from the surface side toward the depth direction.

As shown in FIG. 7C, after removing the mask pattern 23, an entire surface of the concave transfer film 51 is etched by a predetermined depth by dry etching using a gas mixture of, for example, chlorine ($Cl_2$) and sulfur hexafluoride ($SF_6$) as an etching gas. As a result, the carrier supply layer 14 is etched from the upper surface side below the transfer concave portion 51a, and the concave portion 14c having the semicircular cross section is formed in carrier supply layer 14.

As shown in FIG. 7D, after performing annealing so as to eliminate the crystal defects generated by the dry etching, the concave portion transfer film 51 is removed by wet etching or dry etching. After removing the mask pattern 43, the source electrode 16 and the drain electrode 17 are formed laterally of the concave portion 14c on the carrier supply layer 14 using a metallic material which can form an ohmic contact with the carrier supply layer 14, with the distance kept between the source electrode 16 and the drain electrode 17, and the ohmic contact is formed through a heat treatment step. Thereafter, the gate electrode 15 is formed to be filled into the concave portion 14c using a metallic material that can form a Schottky junction with the carrier supply layer 14.

Through these steps, the semiconductor device in the fourth embodiment can be obtained.

According to the method for manufacturing the III-V nitride semiconductor device in the fourth embodiment, the transfer concave portion 51a is formed in the concave portion transfer film 51 consisting of GaAs and the concave portion transfer film 51 is then subjected to the dry etching, whereby the concave portion 14c having an equivalent shape to that of the transfer concave portion 51a can be formed in the carrier supply layer 14. Further, by using amorphous silicon as the material for the concave portion transfer film, the cross-sectional shape of the transfer concave portion 51a is formed into the semicircular shape, the U shape, or the semielliptic shape. The transfer concave portion 51a can be, therefore, formed so that the opening dimension is nonlinearly smaller toward the depth direction.

Further, during the etching for forming the concave portion 14c, an etch selectivity of the material (AlGaN) for the carrier supply layer 14 to the material (Si) for the concave portion transfer film 51 is controlled. It is thereby possible to ensure forming the concave portion 14c while controlling the shape of the concave portion 14c based on the shape of the transfer concave portion 51a. It is particularly preferable to set the etch selectivity at 1 or more.

In the method for manufacturing the III-V nitride semiconductor device in the fourth embodiment, the annealing can be performed under conditions of a temperature of 300° C. or more and 1500° C. or less after the dry etching step of forming the concave portion 14c and before removing the concave portion transfer film 51. If so, crystal defects generated in the carrier supply layer 14 due to a damage of the dry etching can be eliminated. Reliability of the semiconductor device can be thereby improved. Besides, since the annealing is performed before the concave portion transfer film 51 is removed, the carrier supply layer 14 can be annealed while the carrier supply layer 14 is hardly exposed.

In the method for manufacturing the III-V nitride semiconductor device in the fourth embodiment, the material for the concave portion transfer film 51 is not limited to amorphous silicon but may be an arbitrary material with which the concave portion 14c can be formed by the isotropic etching so that the opening dimension is nonlinearly smaller toward the depth direction. For example, silicon oxide, silicon nitride, silicon oxynitride, silicon carbide, or III-V nitride semiconductor can be used as the material for the concave portion transfer film 51.

Moreover, the material for the concave portion transfer film 51 is not limited to amorphous silicon but may be a polycrystalline material consisting of, for example, gallium arsenide, silicon, silicon carbide, gallium phosphide, diamond, or III-V nitride semiconductor.

Embodiment 5

A III-V nitride semiconductor device in the fifth embodiment of the present invention will be described with reference to the drawings.

Figure 8:
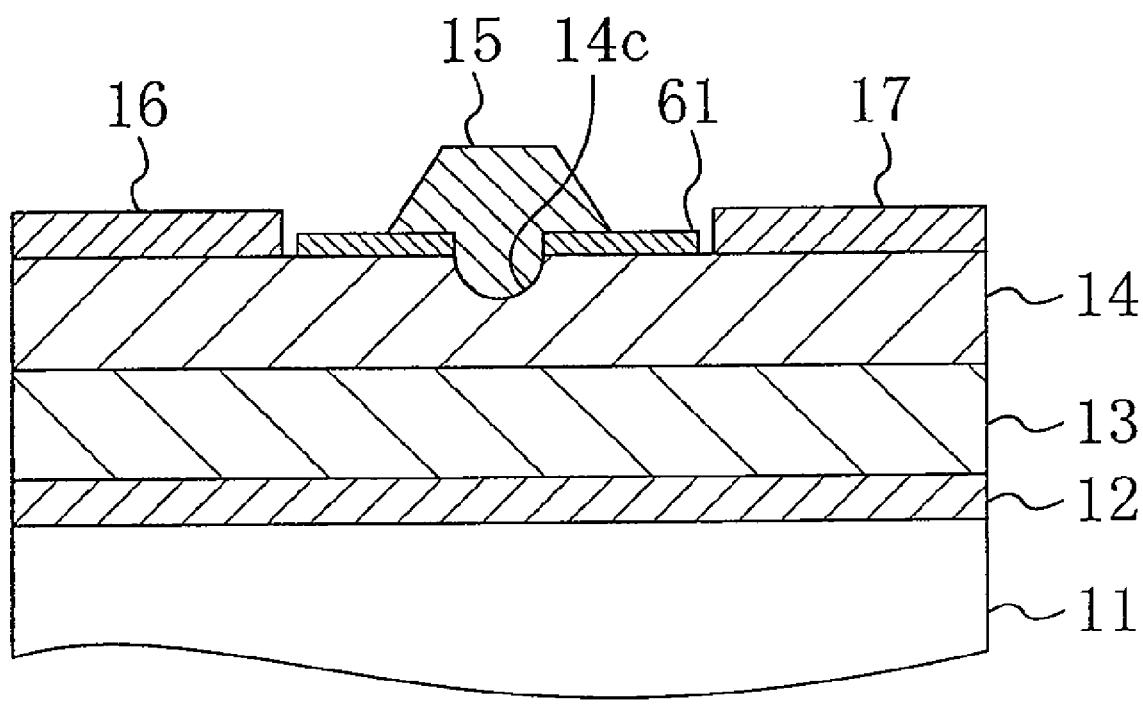
FIG. 8 is cross-sectional block diagram of a III-V nitride semiconductor device in the fifth embodiment of the present invention.
Figure 10:
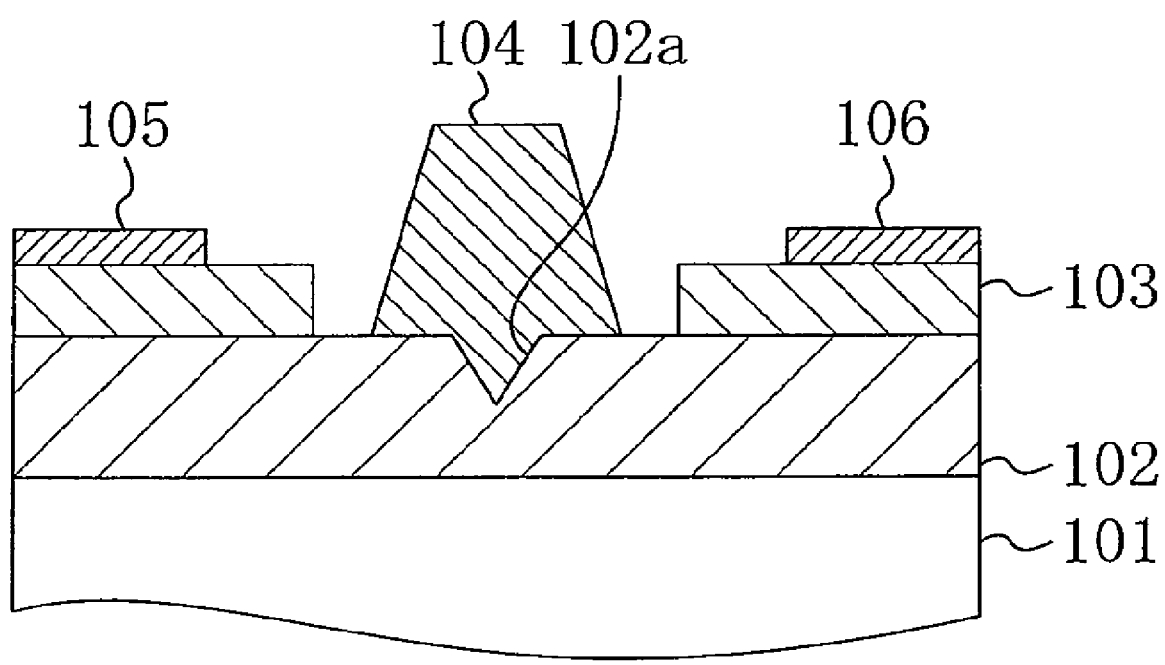
FIG. 10 is cross-sectional block diagram of a conventional GaAs-based HFET device.
Figure 11A:
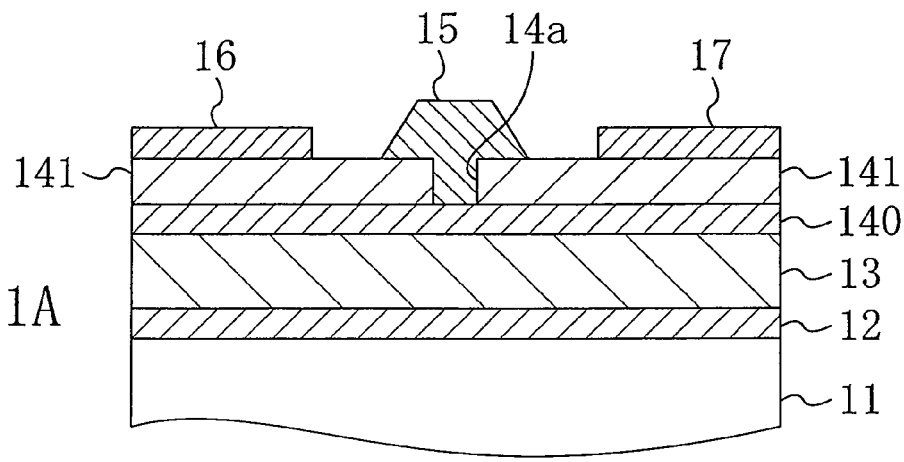
FIG. 11A to 11C are cross-sectional block diagrams of a III-V nitride semiconductor device in another modification of the first embodiment of the present invention.
Figure 11B:
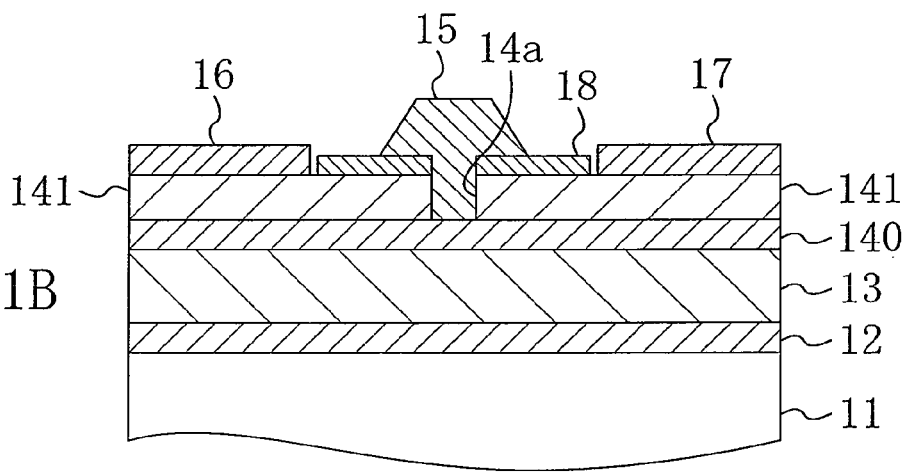
Figure 11C:
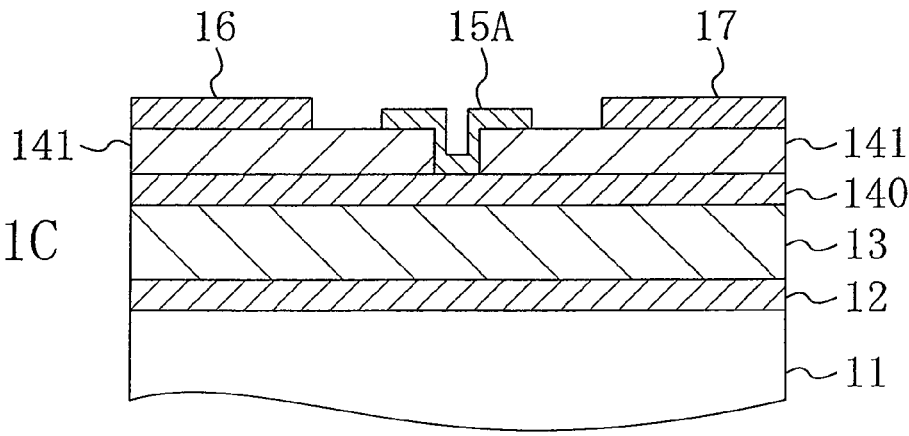
Figure 12A:
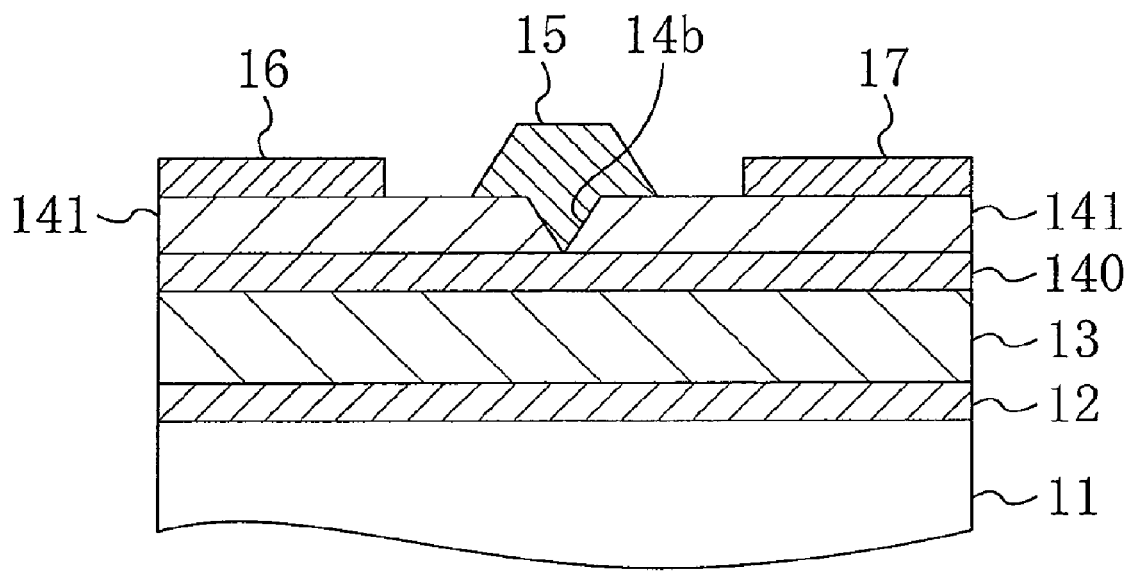
FIG. 12A to FIG. 12B are cross-sectional block diagrams of a III-V nitride semiconductor device in another modification of the second embodiment of the present invention.
Figure 12B:
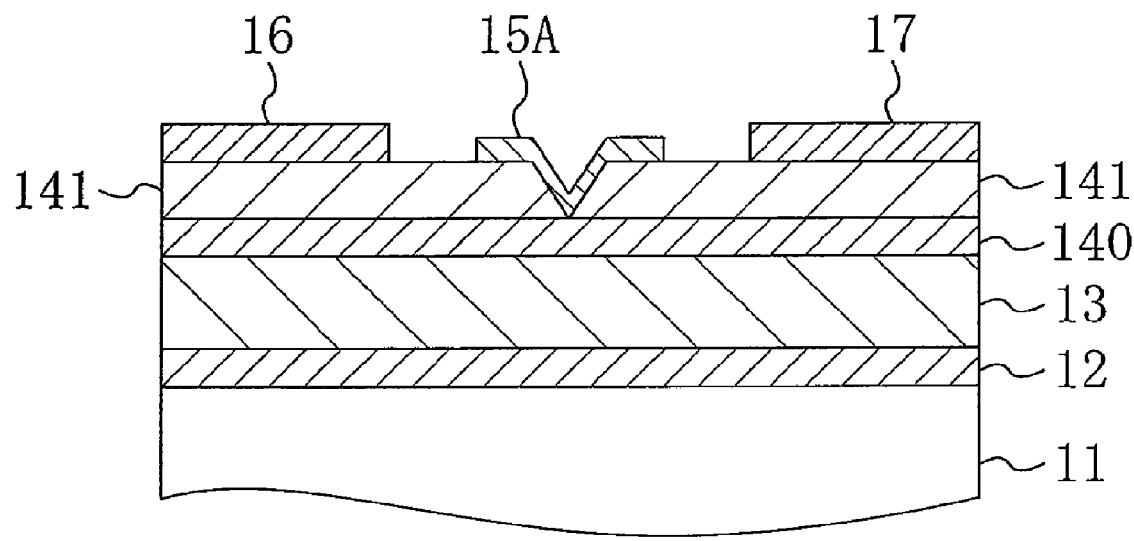

FIG. 8 is a cross-sectional block diagram of the III-V nitride semiconductor device in the fifth embodiment of the present invention. In FIG. 8, same components as those shown in FIG. 6 are denoted by the same reference symbols, respectively, and will not be repeatedly described herein.

As shown in FIG. 8, the III-V nitride semiconductor device in the fifth embodiment is constituted so that a buffer layer 12 consisting of AlN, a channel layer 13 consisting of undoped GaN, and a carrier supply layer 14 consisting of n type AlGaN are formed on a substrate 11 consisting of SiC in this order, and so that a concave portion 14c having a semicircular cross section is provided in the carrier supply layer 14.

In a region on an upper surface of the carrier supply layer 14 in which region a gate electrode 15 is formed, a protection film 61 consisting of amorphous silicon is formed to open an upper portion of the concave portion 14c. The gate electrode 15 is formed on the protection film 61 so as to be filled into the opening portion of the protection film 61 and the concave portion 14c. A source electrode 16 and a drain electrode 17 are formed in regions in which the protection film 61 is not formed on the upper surface of the carrier supply layer 14.

In the III-V nitride semiconductor device in the fifth embodiment, since the protection film 61 is provided on the carrier supply layer 14, a trap density can be reduced in both side portions of the gate electrode 15 on the upper surface of the carrier supply layer 14. It is, therefore, possible to further ensure suppressing the frequency dispersion resulting from the traps on the upper surface of the carrier supply layer 14, as compared with the fourth embodiment.

In the III-V nitride semiconductor device in the fifth embodiment, group IV impurities or group V impurities such as nitrogen (N), phosphorus (P), arsenic (As), antimony (Sb), or bismuth (Bi) impurities are preferably added to the protection film 61. By doing so, even if gallium or aluminum is inadvertently doped into the protection film 61 during crystal growth on the protection film 61, the group IV impurities or group V impurities contained in the protection film 61 can compensate for the inadvertently doped gallium or aluminum and the protection film 61 can be kept to have high resistance. Accordingly, even if the protection film 61 is formed using silicon, a gate leak current resulting from a reduction in specific resistance of protection film 61 does not occur.

It is also preferable that an upper portion of the protection film 61 is oxidized, nitrided, or oxynitrided. By doing so, the protection film 61 can be formed to have a high resistance and can be used as a low-leakage and high-reliability protection film.

Further, a material for the protection film 61 is not limited to amorphous silicon but may be the other amorphous material such as silicon oxide or silicon nitride.

A method for manufacturing the III-V nitride semiconductor device in the fifth embodiment of the present invention will now be described with reference to the drawings.

FIGS. 9A to 9D are cross-sectional block diagrams that depict the method for manufacturing the III-V nitride semiconductor device in the fifth embodiment of the present invention in order of steps. In FIGS. 9A to 9D, same components as those shown in FIGS. 7A to 7D are denoted by the same reference symbols, respectively, and will not be repeatedly described herein.

As shown in FIG. 9A, the buffer layer 12 consisting of AlN, the channel layer 13 consisting of undoped GaN, the carrier supply layer 14 consisting of n type AlGaN, and a concave portion transfer film 51 consisting of amorphous or polycrystalline silicon are formed on the substrate 11 in this order using MOCVD or MBE. A mask pattern 23 including an opening portion 23a is formed on the concave portion transfer film 51 by lithography.

At the step of forming the concave portion transfer film 51, the concave portion transfer film 51 consisting of amorphous silicon may be formed by, for example, vacuum deposition or sputtering instead of the MOCVD or the MBE.

At the crystal growth step shown in FIG. 9A, a reduction in the specific resistance of the concave portion transfer film 42 sometimes disadvantageously occurs due to inadvertent doping of gallium or aluminum into the concave portion transfer film 51. To avoid this, the concave portion transfer film 51 may be formed while adding thereto group IV impurities or group V impurities. By doing so, the group IV impurities or group V impurities can prevent the specific resistance of the concave portion transfer film 51 from being reduced by the inadvertent doping of gallium or aluminum.

As shown in FIG. 9B, a transfer concave portion 51a is formed in the concave portion transfer film 51 exposed to the opening portion 23a of the mask pattern 23 by performing isotropic etching on the concave portion transfer film 51. By performing the isotropic etching on the concave portion transfer film 51, the transfer concave portion 51a can be formed so that the opening dimension is nonlinearly smaller from the surface side toward the depth direction.

As shown in FIG. 9C, after removing the mask pattern 23, an entire surface of the concave transfer film 51 is etched by a predetermined depth by dry etching using a gas mixture of, for example, chlorine ($Cl_2$) and sulfur hexafluoride ($SF_6$) as an etching gas, thereby forming the concave portion 14c having the semicircular cross section in carrier supply layer 14. A mask pattern 43 that covers a region including the concave portion 14c and peripheral portions of the concave portion 14c is formed on the concave portion transfer film 51.

As shown in FIG. 9D, by removing an exposed part of the concave portion transfer film 51 by the etching using the mask pattern 43, a protection film 51A is formed out of the concave portion transfer film 51. After removing the mask pattern 43, the source electrode 16 and the drain electrode 17 are formed laterally of the concave portion 14c on the carrier supply layer 14 using a metallic material which can form an ohmic contact with the carrier supply layer 14, with the distance kept between the source electrode 16 and the drain electrode 17 and the ohmic contact is formed through a heat treatment step. Thereafter, the gate electrode 15 is formed to be filled into the concave portion 14c using a metallic material that can form a Schottky junction with the carrier supply layer 14.

Through these steps, the semiconductor device in the fifth embodiment can be obtained.

According to the method for manufacturing the III-V nitride semiconductor device in the fifth embodiment, since the protection film 51A is formed out of the concave portion transfer film 51, the upper surface of the carrier supply layer 14 is not exposed during manufacturing of the III-V nitride semiconductor device. A crystal interface on the upper surface side of the carrier supply layer 14 can kept in a favorable condition.

In the method for manufacturing the III-V nitride semiconductor device in the fifth embodiment, after the steps of forming the gate electrode 15, the source electrode 16, and the drain electrode 17, the upper portion of the protection film 51A may be, for example, oxidized or nitrided by plasma oxidation or plasma nitriding or may be oxynitrided by the plasma oxidation and the plasma nitriding. By doing so, the resistance of the protection film 51A can be increased and the reliability of the protection film 51A can be improved.

In the method for manufacturing the III-V nitride semiconductor device in the fifth embodiment, annealing can be performed under conditions of a temperature of 300° C. or more and 1500° C. or less after the dry etching step of forming the concave portion 14c and before the step of forming the protection film 51A out of the concave portion transfer film 51. If so, crystal defects generated in the carrier supply layer 14 can be eliminated while the carrier supply layer 14 is covered with the concave portion transfer film 51. Reliability of the semiconductor device can be thereby improved.

In the method for manufacturing the III-V nitride semiconductor device in the fifth embodiment, the material for the concave portion transfer film 51 is not limited to amorphous silicon but may be an arbitrary material with which the concave portion 14c can be formed by the isotropic etching so that the opening dimension is nonlinearly smaller toward the depth direction. For example, silicon oxide, silicon nitride, silicon oxynitride, silicon carbide, or III-V nitride semiconductor can be used as the material for the concave portion transfer film 51.

Moreover, the material for the concave portion transfer film 51 is not limited to amorphous silicon but may be a polycrystalline material consisting of, for example, gallium arsenide, silicon, silicon carbide, gallium phosphide, diamond, or III-V nitride semiconductor.

In the III-V nitride semiconductor devices in the first embodiment to the fifth embodiment, the material for the substrate 11 is not limited to SiC but may be, for example, sapphire or silicon. By appropriately selecting the material for the buffer layer 12 according to the material for the substrate 11, the channel layer 13 and the carrier supply layer 14 can be formed to make lattice matching relative to the substrate 11.

Furthermore, each of the III-V nitride semiconductor devices in the first embodiment to the fifth embodiment is constituted to function as the HFET by providing the channel layer 13 and the carrier transfer layer 14. However, the configuration of each of the III-V nitride semiconductor devices in the first embodiment to the fifth embodiment is not limited to this but may be such that the channel region is formed in one semiconductor layer consisting of a III-V nitride semiconductor or in a multilayer structure consisting of a plurality of III-V nitride semiconductor. For example, each of the III-V nitride semiconductor devices in the first embodiment to the fifth embodiment may be constituted to function as a metal semiconductor FET ("MESFET") by forming one channel layer consisting of n type GaN instead of the channel layer 13 and the carrier supply layer 14.

As stated so far, the semiconductor device and the method for manufacturing the semiconductor device according to the present invention can advantageously reduce the frequency dispersion resulting from the traps between the III-V nitride semiconductor and the Schottky electrode and improve the high frequency characteristics of the device. Therefore, the semiconductor device and the method for manufacturing the semiconductor device according to the present invention are useful as a semiconductor device having a Schottky electrode provided on a semiconductor layer consisting of a III-V nitride semiconductor and a method for manufacturing the semiconductor device.

What is claimed is:

1. A method for manufacturing a semiconductor device comprising steps of:
   sequentially forming a III-V nitride semiconductor layer and a concave portion transfer film on a substrate;
   forming a first concave portion in said concave portion transfer film; and
   etching said concave portion transfer film by a predetermined depth using etching capable of etching said III-V nitride semiconductor layer and said concave portion transfer film, and thereby forming a second concave portion that has an equivalent shape to a shape of said first concave portion, below said first concave portion in said III-V nitride semiconductor layer,
   wherein said concave portion transfer film consists of an amorphous material, and
   the step of forming said first concave portion includes steps of:
   forming a first mask pattern that includes an opening portion in a region in which said first concave portion is formed, on said concave portion transfer film; and
   removing a part of said concave portion transfer film which part is exposed to the opening portion of said first mask pattern by a predetermined depth by isotropic etching.

2. The method for manufacturing a semiconductor device of claim 1, wherein said amorphous material is one of amorphous silicon, silicon oxide, silicon nitride, silicon carbide, and a III-V nitride semiconductor.

3. The method for manufacturing a semiconductor device of claim 1, wherein said concave portion transfer film contains impurities consisting of a group IV element or a group V element.

4. The method for manufacturing a semiconductor device of claim 1, wherein at the step of forming said second concave portion, an etching depth of the etching on said concave portion transfer film is set so that said concave portion transfer film remains on an upper surface of said III-V nitride semiconductor layer, and
   the method further comprises steps of:
   forming a second mask pattern that covers said second concave portion and peripheral portions of the second concave portion, on said concave portion transfer film after the step of forming said second concave portion; and
   forming a film that covers the peripheral portions of the second concave portion from said concave portion transfer film by etching using said second mask pattern.

5. The method for manufacturing a semiconductor device of claim 4, further comprising a step, between the step of forming said second concave portion and the step of forming said film, of conducting a heat treatment to said III-V nitride semiconductor layer at a temperature of 300° C. or more and 1500° C. or less.

6. The method for manufacturing a semiconductor device of claim 4, further comprising a step, after the step of forming said second concave portion, of oxidizing, nitriding, or oxynitriding a surface of said concave portion transfer film.

* * * * *